(12) United States Patent  (10) Patent No.: US 8,026,150 B2
Sasahara et al.  (45) Date of Patent: Sep. 27, 2011

(54) SEMICONDUCTOR DEVICE MANUFACTURING METHOD AND STORAGE MEDIUM

(75) Inventors: Reiko Sasahara, Nirasaki (JP); Jun Tamura, Nirasaki (JP); Shigeru Tahara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 24 days.

(21) Appl. No.: 12/479,137

(22) Filed: Jun. 5, 2009

(65) Prior Publication Data

US 2009/0305480 A1    Dec. 10, 2009

Related U.S. Application Data

(60) Provisional application No. 61/082,036, filed on Jul. 18, 2008.

(30) Foreign Application Priority Data

Jun. 9, 2008 (JP) .................................. 2008-150894

(51) Int. Cl.
*H01L 21/76* (2006.01)
*H01L 21/764* (2006.01)
(52) U.S. Cl. ................................. 438/422; 257/E21.573
(58) Field of Classification Search ........... 438/421–422
See application file for complete search history.

(56) References Cited

U.S. PATENT DOCUMENTS

| 2003/0064577 A1 | 4/2003 | Hsu et al. |
| 2005/0017365 A1* | 1/2005 | RamachandraRao et al. ............................ 257/758 |
| 2007/0077768 A1* | 4/2007 | Fujii et al. ..................... 438/717 |
| 2007/0269956 A1 | 11/2007 | Lavoie et al. |
| 2009/0093100 A1* | 4/2009 | Xia et al. ...................... 438/421 |

FOREIGN PATENT DOCUMENTS

| JP | 2000-208622 | 7/2000 |
| JP | 2007-74004 | 3/2007 |
| KR | 10-2004-0024524 | 3/2004 |
| KR | 10-2007-0019774 | 2/2007 |

OTHER PUBLICATIONS

Office Action issued Dec. 21, 2010, in Korean Patent Application No. 10-2009-0051147 (with English translation).

* cited by examiner

*Primary Examiner* — Savitri Mulpuri
*Assistant Examiner* — Calvin Choi
(74) *Attorney, Agent, or Firm* — Oblon, Spivak, McClelland, Maier & Neustadt, L.L.P.

(57) ABSTRACT

A method of manufacturing a semiconductor device, including an interlayer insulating layer having a dielectric constant of about 1, includes at least one of hydrophobically modifying an interlayer insulating film for insulating lines from each other, before forming air gaps in the interlayer insulating film, and hydrophobically modifying the lines, after forming the air gaps in the interlayer insulating film.

11 Claims, 20 Drawing Sheets

HYDROPHOBIC
MODIFICATION

NO HYDROPHOBIC
MODIFICATION

HYDROPHOBIC
MODIFICATION

NO HYDROPHOBIC
MODIFICATION w<p w=p

SEMICONDUCTOR DEVICE MANUFACTURING METHOD AND STORAGE MEDIUM

FIELD OF THE INVENTION

The present invention relates to a semiconductor device manufacturing method; and more specifically, to a method of manufacturing a semiconductor device including an interlayer insulating film having a dielectric constant of about 1, and a storage medium which allows the method to be performed in a semiconductor device manufacturing system.

BACKGROUND OF THE INVENTION

In order to realize highly integrated semiconductor devices, semiconductor patterns become finer. However, as the patterns become finer, a line pitch becomes smaller. The small line pitch causes an increase in capacity C between lines, thereby causing a large signal delay. A signal delay τ is represented by Eq. 1 below:

$$\tau = R \times C \qquad \text{Eq. 1,}$$

where τ is a signal delay, R is a line resistance and C is a capacity between lines.

As can be seen from Eq. 1 above, it is important to decrease a capacity C between lines in order to decrease a signal delay τ.

In order to decrease a capacity C between lines without widening a line pitch, it is preferable to reduce a dielectric constant of an interlayer insulating film arranged between lines. A representative example of an interlayer insulating film is an $SiO_2$ film. The $SiO_2$ film has a dielectric constant of about 4. Accordingly, one solution to reduce a capacity C between lines is to use an insulating film having a dielectric constant less than 4, what may also be referred to as a low dielectric film (low-k film), as an interlayer insulating film.

Another solution is to remove an interlayer insulating film interposed between lines and form air gaps between the lines. This is because vacuum has a dielectric constant of 1 (see, e.g., Japanese Patent Laid-open Application Nos. 2000-208622 and 2007-74004).

By forming air gaps between lines, the dielectric constant between the lines approximates to 1.

However, in a semiconductor device including air gaps between the lines, which have a dielectric constant of about 1, a solid body such as an interlayer insulating film is not present between the lines. Accordingly, in such a semicondcutror device, how to control a line shape is an essential issue.

Further, the lines are exposed after formation of the air gaps. Accordingly, how to prevent deterioration (e.g., oxidation) of the exposed lines is another essential issue.

SUMMARY OF THE INVENTION

In view of the above, the present invention provides a method of manufacturing a semiconductor device including an interlayer insulating layer having a dielectric constant of about 1, capable of realizing at least one of formation of a good shape of lines and prevention of deterioration in the lines even after forming air gaps, and a storage medium allowing the manufacturing method to be executed in a semiconductor device manufacturing system.

In accordance with a first aspect of the present invention, there is provided a method of manufacturing a semiconductor device including an interlayer insulating layer having a dielectric constant of about 1, the method comprising at least one of: hydrophobically modifying an interlayer insulating film for insulating lines from each other, before forming air gaps in the interlayer insulating film; and hydrophobically modifying the lines, after forming the air gaps in the interlayer insulating film.

In accordance with a second aspect of the present invention, there is provided a semiconductor device manufacturing method comprising: forming an interlayer insulating film on a substrate; forming grooves and/or holes in which lines are to be embedded in the interlayer insulating film; hydrophobically modifying the interlayer insulating film with the grooves and/or holes; embedding the lines in the grooves and/or holes of the hydrophobically modified interlayer insulating film; and forming air gaps in the interlayer insulating film with the lines embedded therein.

In accordance with a third aspect of the present invention, there is provided a semiconductor device manufacturing method comprising: forming an interlayer insulating film with lines embedded therein on a substrate; forming air gaps in the interlayer insulating film; and hydrophobically modifying the interlayer insulating film with the air gaps and/or the lines.

In accordance with a fourth aspect of the present invention, there is provided a semiconductor device manufacturing method comprising: forming an interlayer insulating film on a substrate; forming a sacrificial film on the interlayer insulating film; forming grooves and/or holes, in which lines are to be embedded, in the sacrificial film; hydrophobically modifying the sacrificial film with the grooves and/or holes; embedding lines in the grooves and/or holes of the sacrificial film; and removing the sacrificial film from the interlayer insulating film.

In accordance with a fifth aspect of the present invention, there is provided a semiconductor device manufacturing method comprising: forming sacrificial film with lines embedded therein on an interlayer insulating film; removing the sacrificial film from the interlayer insulating film; and hydrophobically modifying the interlayer insulating film from which the sacrificial film is removed and/or the lines.

In accordance with a sixth aspect of the present invention, there is provided a storage medium storing a program which runs on a computer and, when executed, controls a semiconductor device manufacturing system to perform the methods of the first to fifth aspects.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1A:
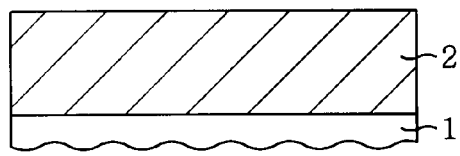
FIGS. 1A to 1G are cross sectional views illustrating a semiconductor device manufacturing method in accordance with a first embodiment of the present invention.

Hereinafter, embodiments of the present invention will be described in detail with reference to the accompanying drawings. In the drawings, elements having substantially the same functions and configurations are denoted by the same reference numerals.

A semiconductor device manufacturing method in accordance with the embodiments of the present invention is a method of manufacturing a semiconductor device including interlayer insulating layers having a dielectric constant of about 1, i.e., a semiconductor device including air gaps. Basically, this method includes at least one of hydrophobically modifying an interlayer insulating film for insulating lines from each other before removing the interlayer insulating film from between the lines in order to form air gaps, and hydrophobically modifying the lines after removing the interlayer insulating film from between the lines in order to form air gaps.

By hydrophobically modifying the interlayer insulating film before removing the interlayer insulating film from between the lines to form air gaps, lines having a desired shape can be formed. For example, grooves and/or holes in which lines are to be embedded are formed in the interlayer insulating film, and the interlayer insulating film is then hydrophobically modified. The hydrophobic modification recovers a damage layer formed on the interlayer insulating film upon forming the grooves and/or holes, and prevents collapse of the grooves and/or holes, thereby maintaining the good shape of the grooves and/or holes. When lines are embedded in the grooves and/or holes maintaining the good shape, they can also have a good shape. Accordingly, the lines can maintain the good shape, even after the interlayer insulating film is removed and the air gaps are formed.

For example, hydrophobic modification is a process for substituting methyl groups ($CH_3$ groups=Me groups, hereinafter, referred to as Me groups) for hydroxyl groups (OH groups) of the damage layer, when the damage layer has OH groups as end groups. As a result, the interlayer insulating film having Me groups as end groups becomes hydrophobic. One example of such a substitution process is a process for treating the interlayer insulating film having grooves under an atmosphere containing, for example, trimethylsilyl dimethylamine (TMSDMA) as a hydrophobic modification agent. This treatment contributes to recovery of the damage layer formed on the interlayer insulating film and prevention of collapse of grooves.

Further, when the interlayer insulating film is a low-k film whose dielectric constant is lower than that of $SiO_2$ (e.g., lower than 4), the dielectric constant increased by the formation of the damage layer including OH groups can be decreased by the hydrophobic modification, i.e., substitution of Me groups for OH groups (recovery of a dielectic constant).

Further, when a low-k film is a porous low-k film having pores, the hydrophobic modification can provide an advantage, i.e., pore sealing effect, to prevent metal of lines or barrier metal from infiltrating into the porous low-k film. In a conventional method for preventing the infiltration, a new film is formed to seal pores. However, the hydrophobic modification prevents the infiltration without formation of a new film, so that lines can be formed in a desired shape.

Specific conditions of hydrophobic modification are as follows. For example, when an interlayer insulating film is formed of a low-k material to have a film thickness of 150 nm and TMSDMA is used as a hydrophobic modifying agent, the hydrophobic modification is carried out at a processing temperature (substrate temperature) of 250° C. and a processing pressure (pressure inside chamber) of 0.67 Pa (5 mT) for a processing time of 1 min.

Further, in addition to TMSDMA, any compound containing silazane (Si—N) bonds may be used as a hydrophobic modification agent. Examples of compounds suitable for a hydrophobic modification agent include:

1,1,3,3-tetramethyldisilazane (TMDS),
hexamethyldisilazane (HMDS),
dimethylsilyldimethylamine (DMSDMA),
trimethylmethylaminosilane (TMMAS),
trimethyl(isocyanato)silane (TMICS),
trimethylsilylacetylene (TMSA), trimethylsilycyanide (TMSC),
1-trimethylsilylpyrole (TMSPyrole),
N,O-bis(trimethylsilyl)trifluoroacetamide (BSTFA),
bis(dimethylamino)dimethylsilane (BDMADMS) and the like.

Further, the interlayer insulating film is removed from between the lines in order to form air gaps, and the lines are hydrophobically modified, thereby preventing deterioration of the lines after formation of the air gaps. For example, when exposed lines are hydrophobically modified, a reduction effect can be obtained. That is, a deteriorated layer, e.g., an oxide layer, formed on the surface of the exposed lines, is reduced.

Further, when the interlayer insulating film remains on the bottom of the air gaps, the interlayer insulating film is hydrophobically modified. Accordingly, it is possible to prevent an oxidizing agent (e.g., moisture) from scattering into the air gaps. Thus, the deterioration of the lines can be prevented even after formation of the air gaps.

Also, after the interlayer insulating film is removed from between the lines, the lines are hydrophobically modified under the following conditions. For example, when barrier metal of lines is formed of tantalum (Ta) to have a film thickness of 5 nm and TMSDMA is used as a hydrophobic modification agent, the hydrophobic modification is carried out at a processing temperature (substrate temperature) of 250° C. and a processing pressure (pressure inside chamber) of 0.67 Pa (5 mT) for a processing time of 1 min.

Also, in addition to TMSDMA, a compound containing silazine bonds as described above may be used as the hydrophobic modification agent.

As described above, in the semiconductor device manufacturing method in accordance with the embodiment of the present invention, the interlayer insulating film is hydrophobically modified before being removed from between lines. Accordingly, the lines can be formed in a good shape in the semiconductor device including interlayer insulating layers having a dielectric constant of about 1.

Also, after the interlayer insulating film for insulating the lines from each other is removed from between the lines, the lines are hydrophobically modified. Accordingly, deterioration of the lines can be prevented even after formation of air gaps in the semiconductor device including interlayer insulating layers having a dielectric constant of about 1.

Hereinafter, specific embodiments of the present invention will be described.

There are broadly two methods for forming air gaps between lines. One is an etch-back method in which an interlayer insulating film is etched-back by using the lines as a mask and the other is a sacrificial film method in which lines are formed in a sacrificial film and the sacrificial film is then removed.

First, specific embodiments for forming air gaps by using the etch-back method will be explained in detail.

First Embodiment

FIGS. 1A to 1G and FIGS. 2A to 2C are cross sectional views illustrating a semiconductor device manufacturing method in accordance with a first embodiment of the present invention.

First, as shown in FIG. 1A, an interlayer insulating film 2 is formed on a substrate 1. In this case, the substrate 1 includes a semiconductor substrate (semiconductor wafer), and a base film such as an interlayer insulating film, an antireflection film and lines formed on the semiconductor substrate. That is, the substrate 1 is a base structure including the semiconductor substrate and the base film.

Figure 1B:
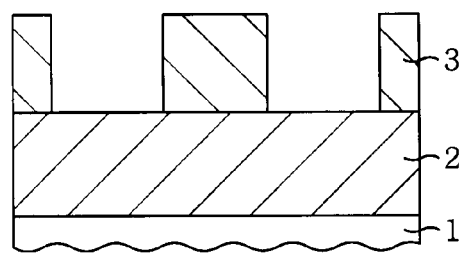

Then, as shown in FIG. 1B, a photoresist pattern 3, serving as a mask to form grooves and/or holes in which lines are to be embedded, is formed on the interlayer insulating film 2.

Figure 1C:
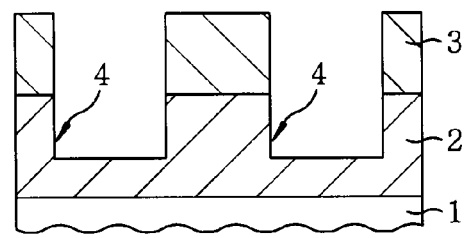

Then, as shown in FIG. 1C, the interlayer insulating film 2 is etched by using the photoresist pattern 3 as a mask to form grooves and/or holes 4, in which lines are to be embedded, in the interlayer insulating film 2.

Figure 1D:
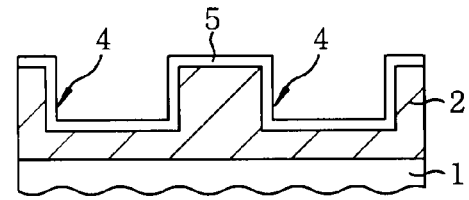

Then, as shown in FIG. 1D, the photoresist pattern 3 is removed by ashing. Consequently, a damage layer 5 is formed on the exposed surface of the interlayer insulating film 2 by the etching shown in FIG. 1C and the ashing.

Figure 1E:
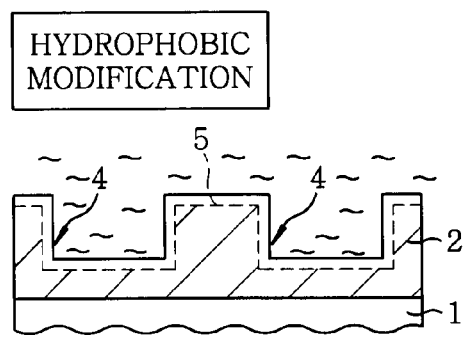

Then, as shown in FIG. 1E, the interlayer insulating film 2 having the grooves and/or holes 4 is hydrophobically modified. Conseqeuntly, the damage layer 5 formed on the interlayer insulating film 2 is recovered.

Figure 1F:
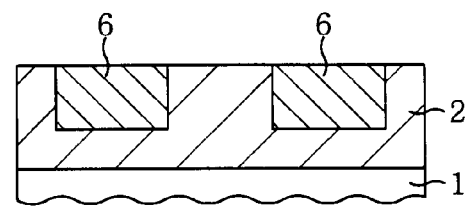

Then, as shown in FIG. 1F, lines 6 are embedded in the grooves and/or holes 4 of the hydrophobically modified interlayer insulating film 2. Preferably, the embedding of the lines 6 may be carried out by using a well-known damascene method.

Figure 1G:
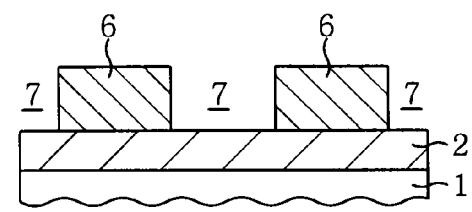
Figure 2A:
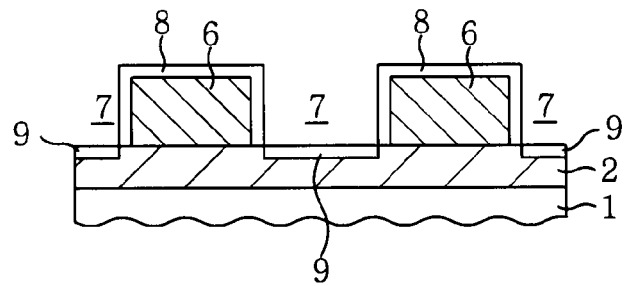
FIGS. 2A to 2C are cross sectional views illustrating the semiconductor device manufacturing method in accordance with the first embodiment of the present invention.

Then, as shown in FIG. 1G, the interlayer insulating film 2 with the lines 6 embedded therein is etched by using the lines 6 as a mask in this embodiment, so that air gaps 7 are formed in the interlayer insulating film 2. When the air gaps 7 are formed, as shown in FIG. 2A, a deteriorated layer, e.g., an oxide layer 8, is formed on the exposed surface of the lines 6. Further, in this embodiment, the interlayer insulating film 2 remains at the bottom of the air gaps 7. A new damage layer 9 is formed on the surface of the interlayer insulating film 2, which is exposed at the bottom of the air gaps 7.

Figure 2B:
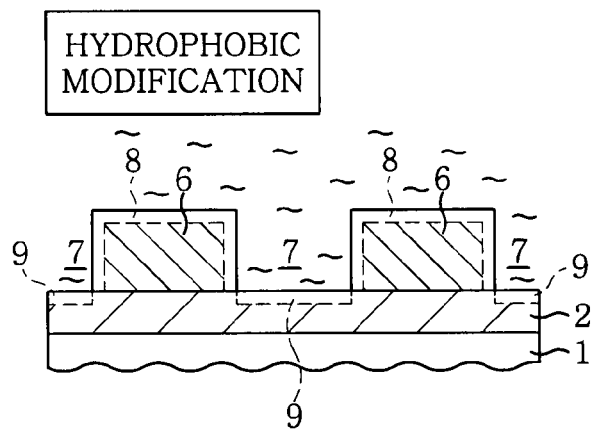

Then, as shown in FIG. 2B, the interlayer insulating film 2 with the air gaps 7 and the lines 6 are hydrophobically modified. Consequently, the damage layer 9 formed on the interlayer insulating film 2 is recovered. Also, the deteriorated layer, i.e., oxide layer 8, formed on the lines 6 is reduced and then removed.

Figure 2C:
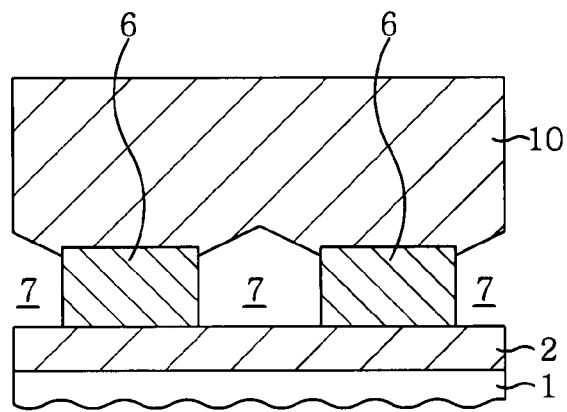

Then, as shown in FIG. 2C, an interlayer insulating film 10 is formed on the lines 6 and the air gaps 7. The interlayer insulating film 10 is formed with poor step coverage such that the air gaps 7 are not filled.

FIGS. 3A and 3B and FIGS. 4A and 4B are cross sectional views illustrating advantages of the manufacturing method of the first embodiment.

Figure 3A:
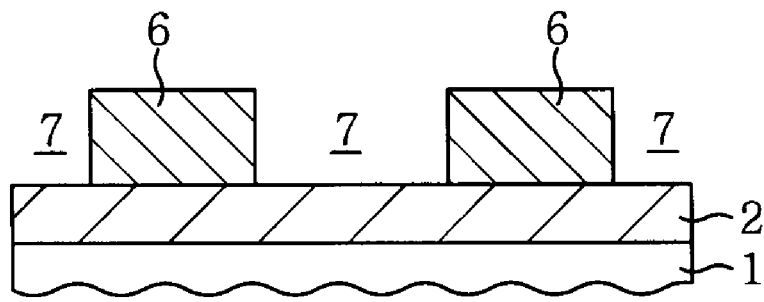
FIGS. 3A and 3B are cross sectional views illustrating advantages of the manufacturing method of the first embodiment.
Figure 3B:
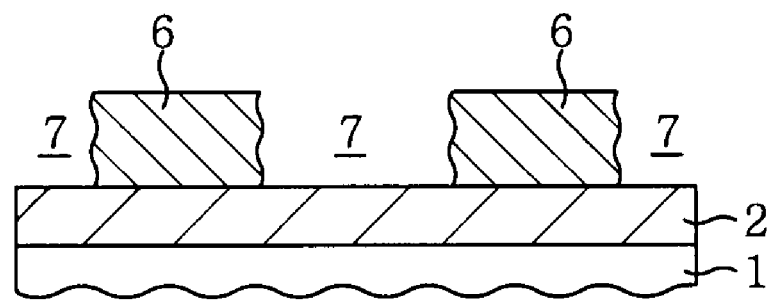

In accordance with the manufacturing method of the first embodiment, as shown in FIG. 1E, the grooves and/or holes 4 are formed in the interlayer insulating film 2, and the interlayer insulating film 2 is then hydrophobically modified. Accordingly, the damage layer 5 formed on the interlayer insulating film 2 is recovered as described above. Consequently, the lines 6 have the better shape, as shown in FIG. 3A, compared to the case in which no hydrophobic modification is performed (FIG. 3B). As the lines 6 are formed in a good shape, deviation of resistance of the lines can be reduced, compared to the case wherein the lines 6 are randomly deformed (FIG. 3B). Thus, it provides an advantage that high-quality semiconductor integrated circuit devices having low deviation of circuit characteristics can be obtained with good production yield.

Further, in accordance with the manufacturing method of the first embodiment, as shown in FIG. 2B, the air gaps 7 are formed in the interlayer insulating film 2, and the lines 6 and the interlayer insulating film 2 are then hydrophobically modified. Accordingly, the lines 6 may have no deteriorated layer (e.g., oxide layer 8) on their surfaces, as shown in FIG.

Figure 4A:
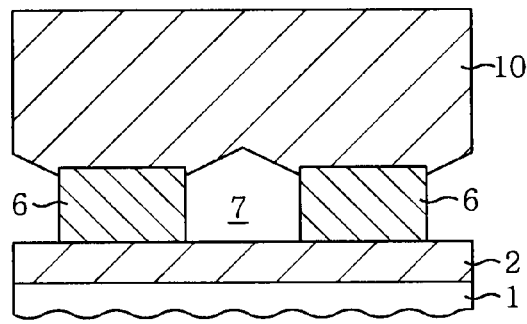
FIGS. 4A and 4B are cross sectional views illustrating advantages of the manufacturing method of the first embodiment.
Figure 4B:
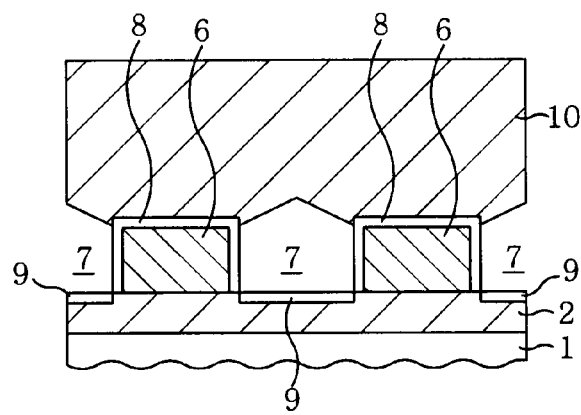

4A, contrary to the case in which the lines 6 are not hydrophobically modified (FIG. 4B). Thus, an increase in resistance of the lines 6 can be suppressed compared to the case wherein the lines 6 have a deteriorated layer (e.g., oxide layer 8) on their surfaces. It also provides an advantage that high-quality semiconductor integrated circuit devices having low deviation of circuit characteristics can be obtained with good production yield.

Further, when the interlayer insulating film 2 is formed on the bottom of the air gaps 7, the interlayer insulating film 2 may have no damage layer 9 (e.g., damage layer 9 containing OH groups) on its surface, as shown in FIG. 4A, contrary to the case in which the interlayer insulating film 2 is not hydrophobically modified (FIG. 4B). As the interlayer insulating film 2 has no damage layer 9, it is possible to prevent a substance (e.g., moisture) causing deterioration of the lines 6 from scattering into the air gaps 7. As a result, it possible to suppress deterioration of the lines 6 after the formation of the air gaps 7, e.g., formation of an oxide layer 8 on the surface exposed to the air gaps 7, with the passage of time. It provides an advantage of obtaining semiconductor integrated circuit devices that do not undergo deterioration with the passage of time and stably operate for a long time.

Second Embodiment

Figure 5:
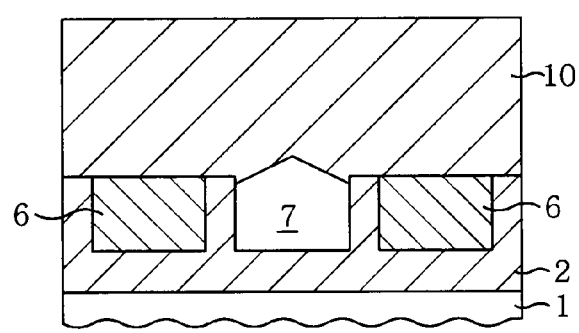
FIG. 5 is a cross sectional view illustrating a semiconductor device manufactured by a semiconductor device manufacturing method in accordance with a second embodiment of the present invention.

FIG. 5 is a cross sectional view illustrating a semiconductor device manufactured by a semiconductor device manufacturing method in accordance with a second embodiment of the present invention.

In the manufacturing method of the first embodiment, the air gaps 7 are formed by entirely removing the interlayer insulating film 2 between the lines 6. However, the air gaps 7 may be formed under the condition that the interlayer insulating film 2 remains on the sidewalls of the lines 6. In this case, the interlayer insulating film 2 may remain on the sidewalls of the lines 6 throughout the semiconductor integrated circuit device. Alternatively, the semiconductor integrated circuit device may have both a portion in which the interlayer insulating film 2 remains on the sidewalls of the lines 6 and a portion in which the interlayer insulating film 2 is entirely removed from between the lines 6.

FIGS. 6A to 6E are cross sectional views illustrating a semiconductor device manufacturing method in accordance with the second embodiment of the present invention.

Figure 6A:
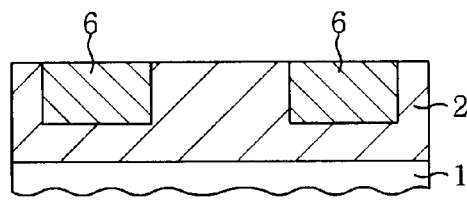
FIGS. 6A to 6E are cross sectional views illustrating the semiconductor device manufacturing method in accordance with the second embodiment of the present invention.

First, as shown in FIG. 6A, an interlayer insulating film 2 with lines 6 embedded therein is formed on a substrate 1. The interlayer insulating film 2 may be formed by using the method explained with reference to FIGS. 1A to 1F, or another method well-known in the art.

Figure 6D:
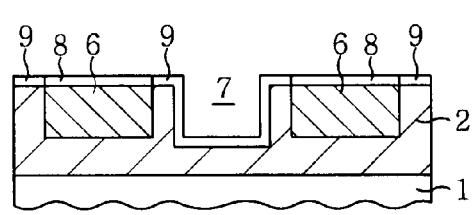
Figure 6B:
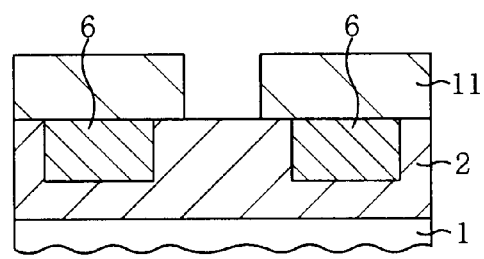

Then, as shown in FIG. 6B, a photoresist pattern 11 serving as a mask to form air gaps is formed on the interlayer insulating film 2.

Figure 6E:
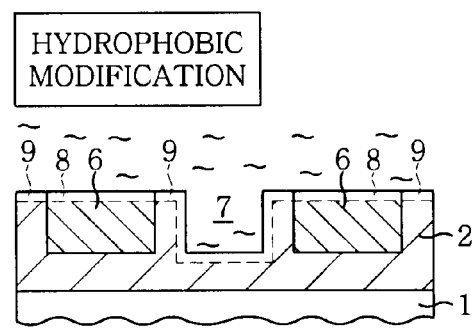
Figure 6C:
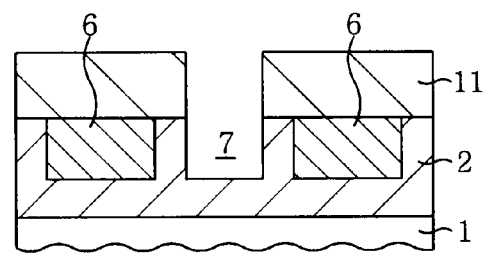

Then, as shown in FIG. 6C, the interlayer insulating film 2 is etched by using the photoresist pattern 11 as a mask, so that air gaps 7 are formed in the interlayer insulating film 2.

Then, as shown in FIG. 6D, the photoresist pattern 11 is removed by ashing. A damage layer 9 is formed on the exposed surface of the interlayer insulating film 2 by the etching shown in FIG. 6C and the ashing of the photoresist pattern 11. Also, a deteriorated layer, e.g., an oxide layer 8, is formed on the exposed surface of the lines 6 by the ashing of the photoresist pattern 11.

Then, as shown in FIG. 6E, the interlayer insulating film 2 with the air gaps 7 and the lines 6 are hydrophobically modified. Consequently, the damage layer 9 formed on the interlayer insulating film 2 is recovered. Also, the deteriorated layer (the oxide layer 8 in this embodiment) formed on the lines 6 is reduced and then removed.

Then, as shown in FIG. 5, an interlayer insulating film 10 is formed on the lines 6 and the air gaps 7. The interlayer insulating film 10 is formed with poor step coverage such that the air gaps 7 are not filled.

Figure 7A:
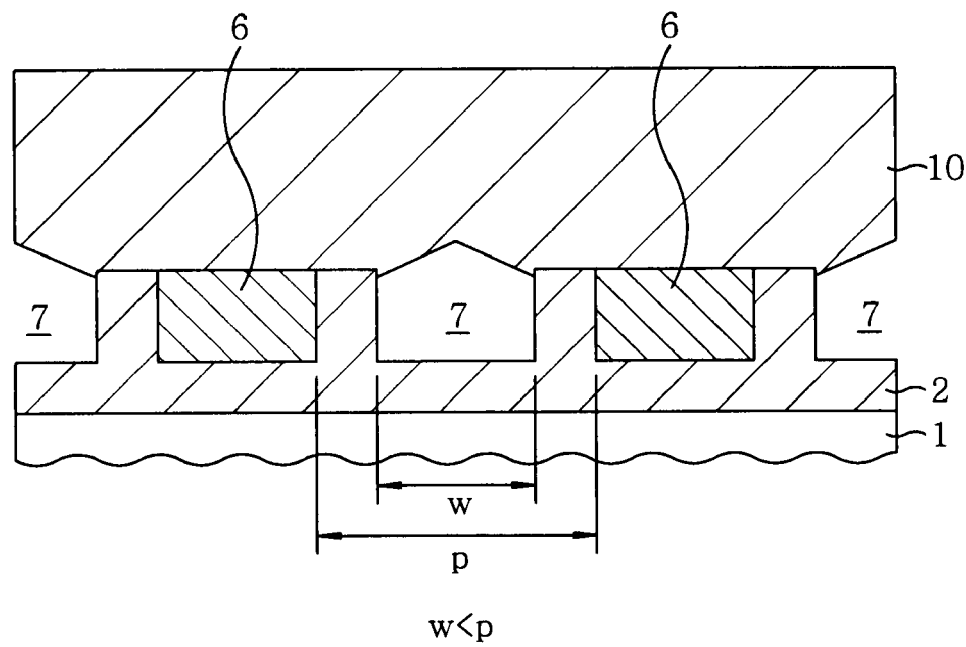
FIGS. 7A and 7B are cross sectional views illustrating advantages obtained by the manufacturing method of the second embodiment.
Figure 7B:
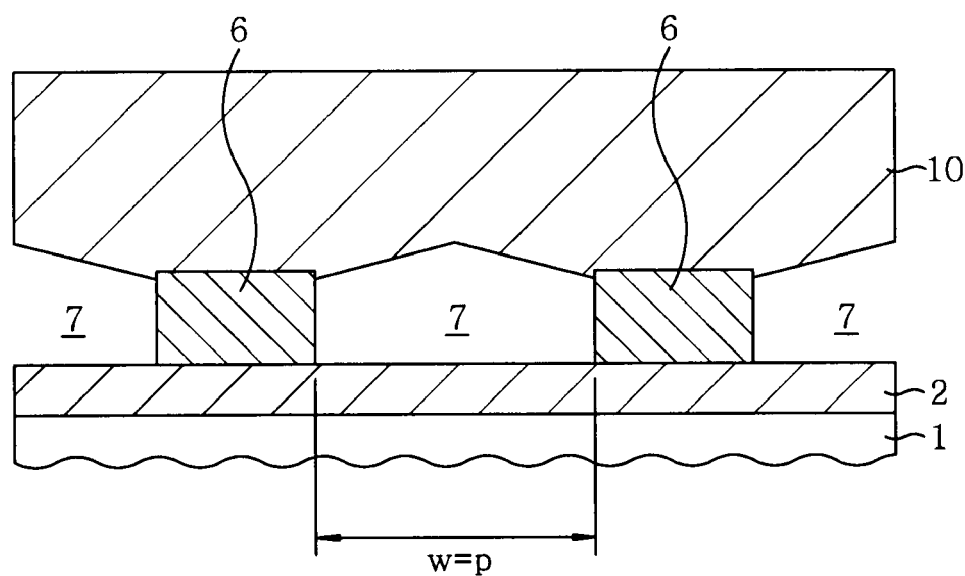

FIGS. 7A and 7B are cross sectional views illustrating advantages obtained by the manufacturing method of the second embodiment.

The manufacturing method of the second embodiment has the same advantages as the manufacturing method of the first embodiment.

Further, in accordance with the manufacturing method of the second embodiment, the air gaps 7 are formed under the condition that the interlayer insulating film 2 remains on the sidewalls of the lines 6. Accordingly, as shown in FIG. 7A, for example, when a space p between the lines 6 is wide, a width w of the air gaps 7 can be formed to be smaller than the space p. When the air gaps 7 are formed to have a width w narrower than the space p, a mechanical strength around the air gaps 7 increases compared to the case in which the air gaps 7 have the same width w as the space p (FIG. 7B). The increased mechanical strength provides semiconductor integrated circuit devices which are not readily damaged during and after the manufacturing process.

Further, in the manufacturing method of the second embodiment, since the interlayer insulating film 2 remains between the lines 6, a low-k film having a low dielectric constant is preferably used as the interlayer insulating film 2.

Third Embodiment

Figure 8:
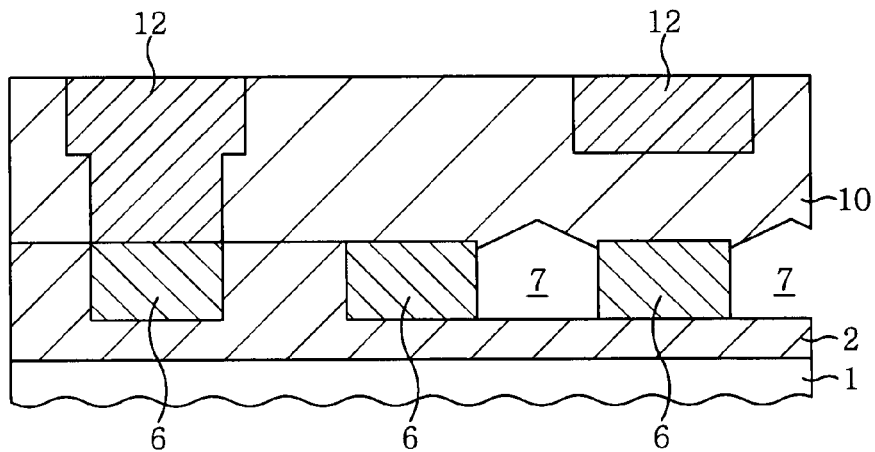
FIG. 8 is a cross sectional view illustrating a semiconductor device manufactured by a semiconductor device manufacturing method in accordance with a third embodiment of the present invention.

FIG. 8 is a cross sectional view illustrating a semiconductor device manufactured by a semiconductor device manufacturing method in accordance with a third embodiment of the present invention.

The semiconductor device wherein the interlayer insulating film 2 remains on the sidewalls of the lines 6 is not limited only to the case in which the space p between the lines 6 is wide.

For example, as shown in FIG. 8, it may be applied to portions in which the lines 6 are in contact with upper lines 12.

Figure 9A:
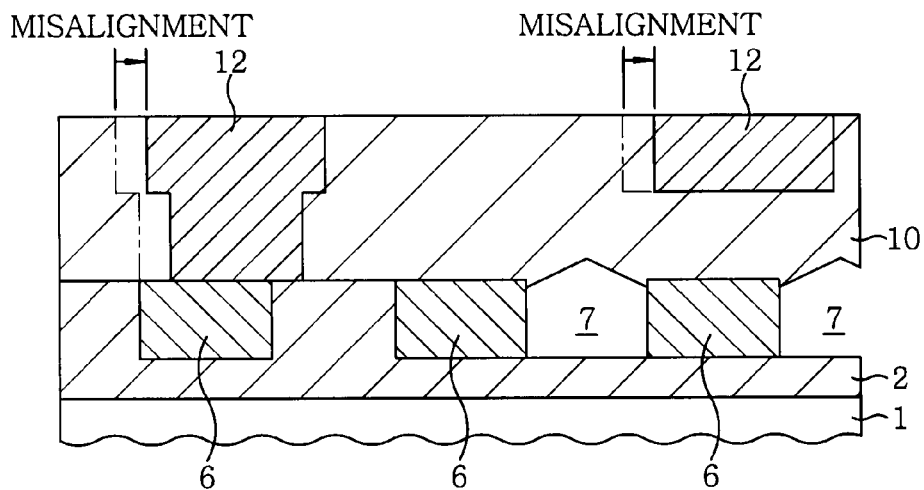
FIGS. 9A and 9B are cross sectional views illustrating advantages obtained by the manufacturing method of the third embodiment.
Figure 9B:
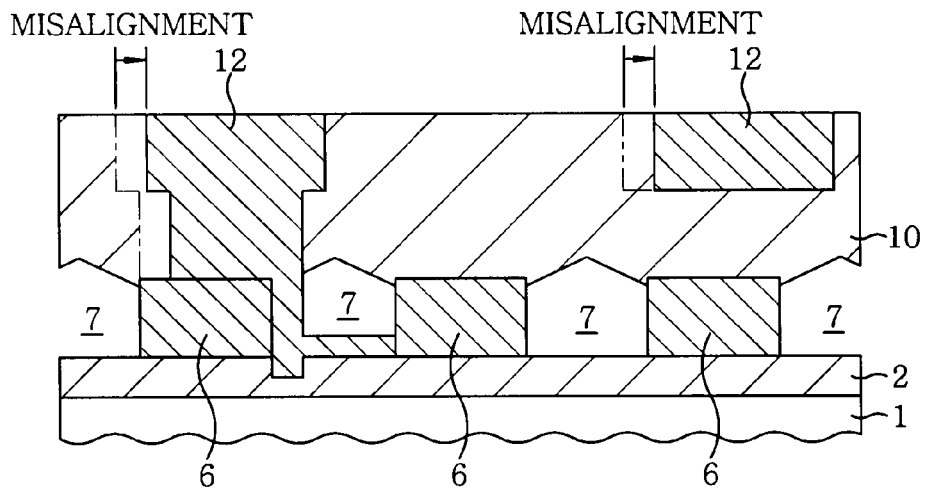

FIGS. 9A and 9B are cross sectional views illustrating advantages obtained by the manufacturing method of the third embodiment.

As shown in FIG. 9A, the interlayer insulating film 2 remains on sidewalls of the lines 6 in contact with the upper lines 12. In this case, although the upper lines 12 are misaligned, the upper lines 12 can come in contact with the lines 6.

When the air gaps 7 are formed at portions in which the lines 6 are in contact with the upper lines 12, the upper lines 12 may be misaligned as shown in FIG. 9B. In this case, the bottom parts of the air gaps 7 may be deepened, or a short circuit between the lines 6 may occur via a conductor forming the upper lines 12, thereby causing a failure.

The failure can be solved by leaving the interlayer insulating film 2 on sidewalls of the lines 6 in contact with the upper lines 12.

The semiconductor device formed by the manufacturing method of the third embodiment includes both a portion in which the interlayer insulating film 2 remains on the sidewalls of the lines 6 and a portion in which the interlayer insulating film 2 is entirely removed from between the lines 6. An example of the semiconductor device manufacturing method will be illustrated.

FIGS. 10A to 10C and FIGS. 11A to 11C are cross sectional views illustrating the semiconductor device manufacturing method in accordance with the third embodiment of the present invention.

Figure 10A:
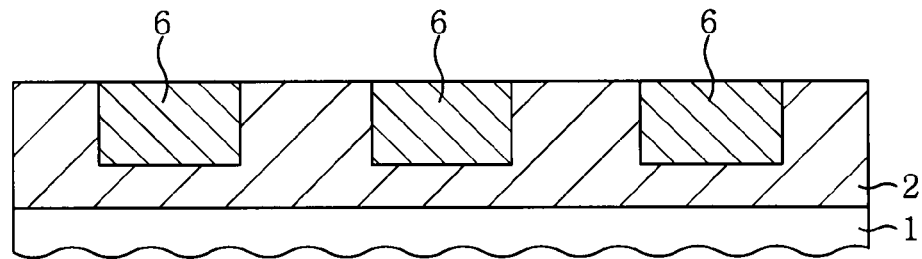
FIGS. 10A to 10C are cross sectional views illustrating the semiconductor device manufacturing method in accordance with the third embodiment of the present invention.

First, as shown in FIG. 10A, the interlayer insulating film 2 with the lines 6 embedded therein is formed on a substrate 1. The interlayer insulating film 2 may be formed by using the manufacturing method illustrated with reference to FIGS. 1A to 1F, or another method well-known in the art.

Figure 10B:
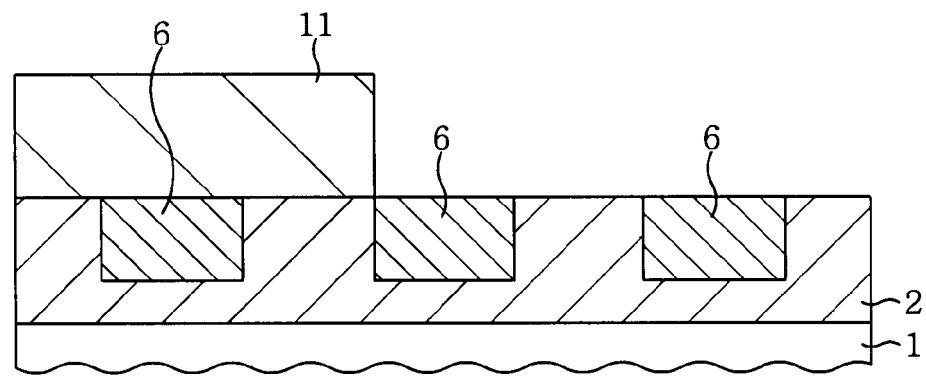

Then, as shown in FIG. 10B, a photoresist pattern 11 serving as a mask to form air gaps is formed on the interlayer insulating film 2.

Figure 10C:
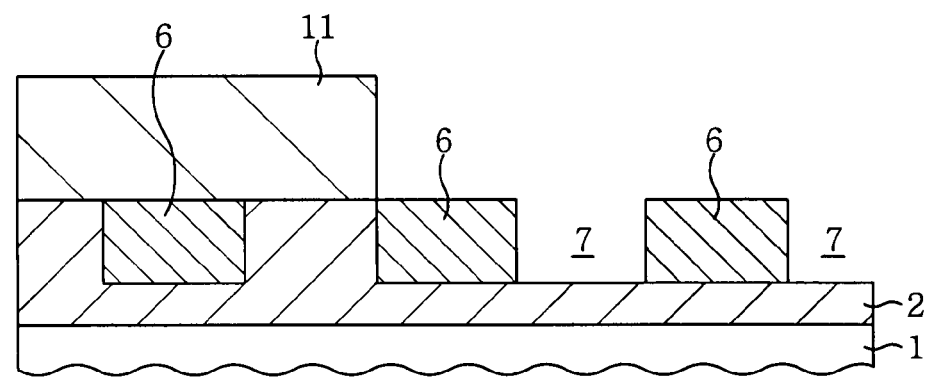

Then, as shown in FIG. 10C, the interlayer insulating film 2 is etched by using the photoresist pattern 11 as a mask, so that air gaps 7 are formed on the interlayer insulating film 2.

Figure 11A:
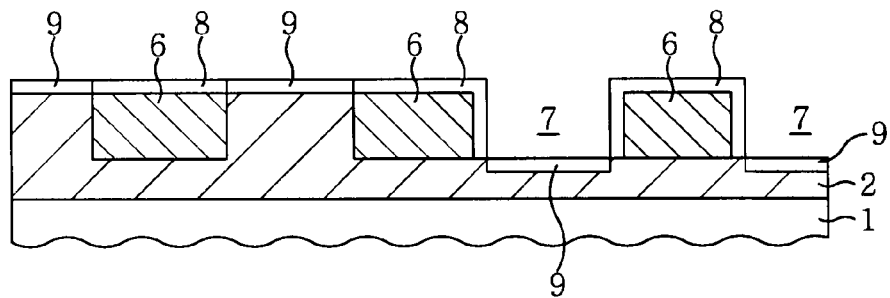
FIGS. 11A to 11C are cross sectional views illustrating the semiconductor device manufacturing method in accordance with the third embodiment of the present invention.

Then, as shown in FIG. 11A, the photoresist pattern 11 is removed by ashing. A damage layer 9 is formed on the exposed surface of the interlayer insulating film 2 by the etching shown in FIG. 10C and the ashing of the photoresist pattern 11. Also, a deteriorated layer, e.g., an oxide layer 8, is formed on the exposed surface of the lines 6 by the etching shown in FIG. 10C and the ashing of the photoresist pattern 11.

Figure 11B:
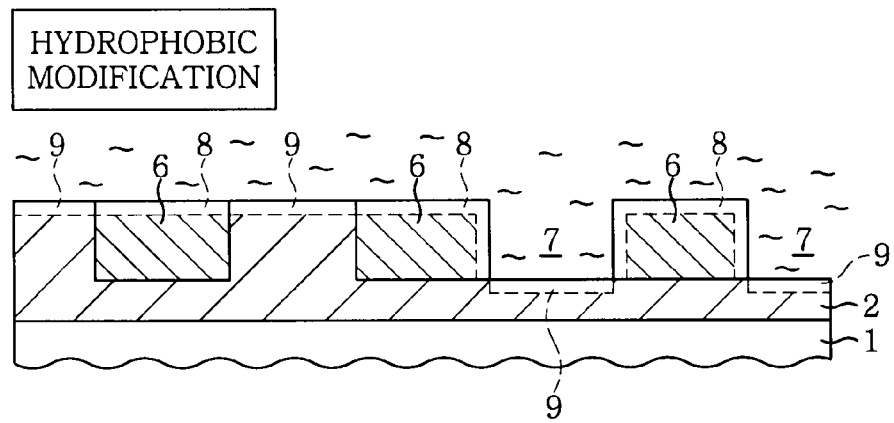

Then, as shown in FIG. 11B, the interlayer insulating film 2 with the air gaps 7 and the lines 6 are hydrophobically modified. Consequently, the damage layer 9 formed on the interlayer insulating film 2 is recovered. Further, the deteriorated layer (the oxide layer 8 in this embodiment) formed on the lines 6 is reduced and then removed.

Figure 11C:
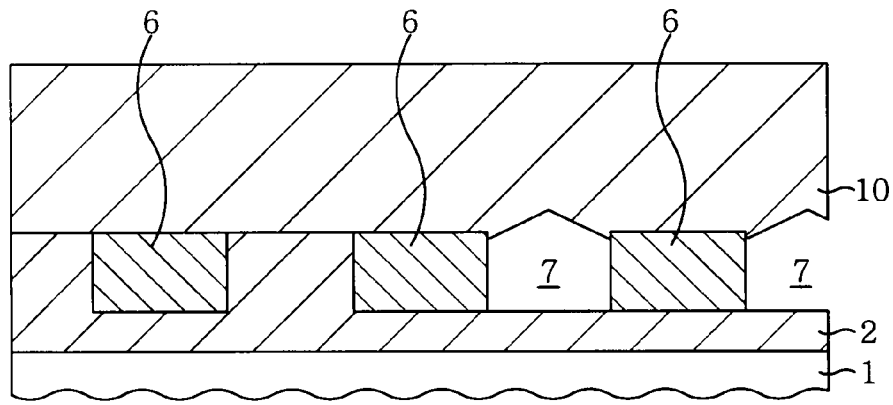

Then, as shown in FIG. 11C, an interlayer insulating film 10 is formed on the lines 6 and the air gaps 7. The interlayer insulating film 10 is formed with poor step coverage such that the air gaps 7 are not filled.

Then, as shown in FIG. 8, upper lines 12 are formed on the interlayer insulating film 10. The formation of the upper lines 12 on the interlayer insulating film 10 may be carried out by using the manufacturing method explained with reference to FIGS. 1A to 1F, or another method well-known in the art.

The semiconductor device manufactured by the method of the third embodiment includes both a portion in which the interlayer insulating film 2 remains on the sidewalls of the lines 6 and a portion in which the interlayer insulating film 2 is entirely removed from between the lines 6.

The manufacturing method of the third embodiment has the same advantages as the manufacturing method of the first embodiment.

Also, in accordance with the manufacturing method of the third embodiment, as described above, the interlayer insulating film 2 partially remains on sidewalls of the lines 6. Accordingly, although misalignment of upper lines occurs in the portion in which the interlayer insulating film 2 remains, occurrence of abnormal etching in the air gaps 7, a short circuit between the lines 6 or the like can be prevented. Thus, there is an advantage that semiconductor devices can be manufactured with good production yield.

Next, specific embodiments for forming air gaps by using a sacrificial film method will be illustrated.

Fourth Embodiment

FIGS. 12A to 12D and FIGS. 13A to 13D are cross sectional views illustrating a semiconductor device manufacturing method in accordance with a fourth embodiment of the present invention.

Figure 12A:
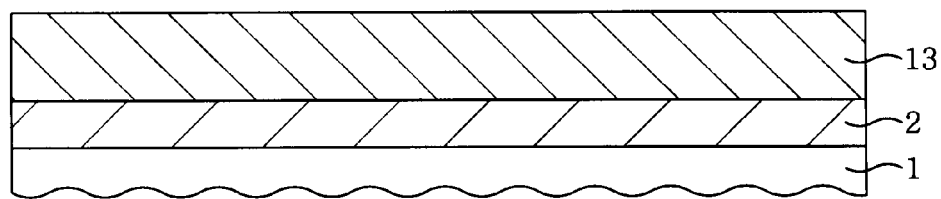
FIGS. 12A to 12D are cross sectional views illustrating a semiconductor device manufacturing method in accordance with a fourth embodiment of the present invention.

First, as shown in FIG. 12A, an interlayer insulating film 2 is formed on a substrate 1. Then, a sacrificial film 13 is formed on the interlayer insulating film 2. The sacrificial film 13 is made of a material having higher etching selectivity than the interlayer insulating film 2 and lines 6 to be formed in a subsequent process. That is, the material of the sacrificial film 13 is selected such that the sacrificial film 13 is readily etched while the interlayer insulating film 2 and the lines 6 are hardly etched.

Specifically, when the interlayer insulating film 2 is made of a SiOC-based low-k material and the lines 6 are made of copper (Cu) while tantalum (Ta) is used as barrier metal, the sacrificial film 13 may be made of $SiO_2$.

Figure 12B:
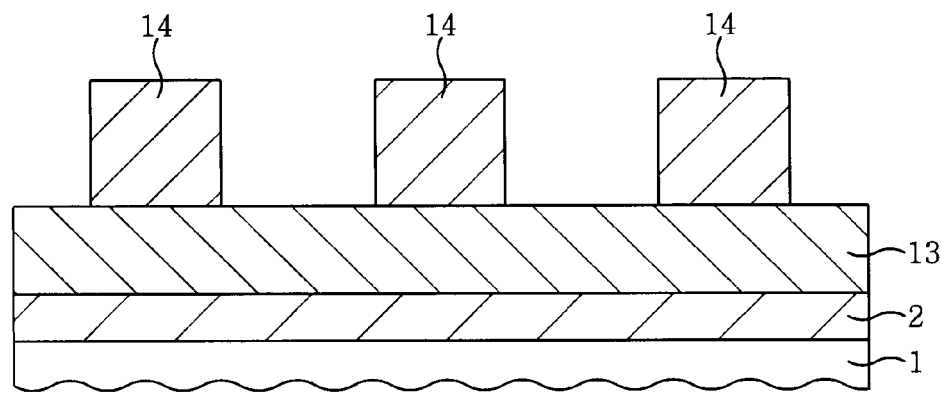

Then, as shown in FIG. 12B, a photoresist pattern or hard mask pattern 14 is formed on the sacrificial film 13 in order to form grooves and/or holes, in which lines 6 are to be embedded, in the sacrificial film 13. In this embodiment, the hard mask pattern 14 is employed.

Figure 12C:
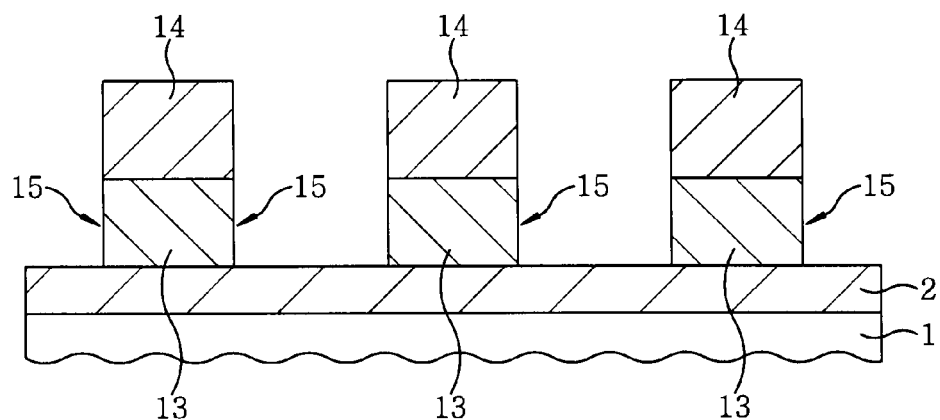

Then, as shown in FIG. 12C, the sacrificial film 13 is etched by using the hard mask pattern 14 as a mask, and grooves and/or holes 15, in which the lines 6 will be embedded, are formed in the sacrificial film 13.

Figure 12D:
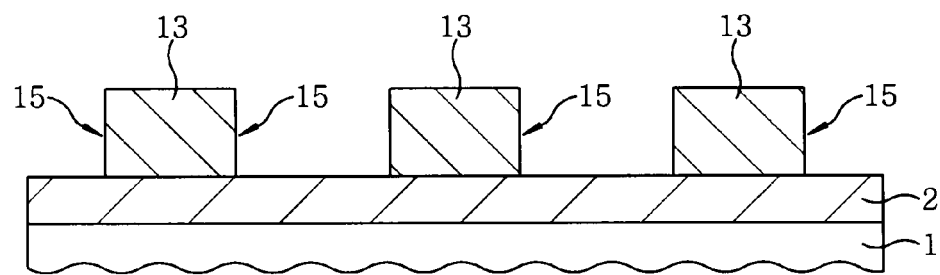

Then, as shown in FIG. 12D, the hard mask pattern 14 is removed.

Figure 13A:
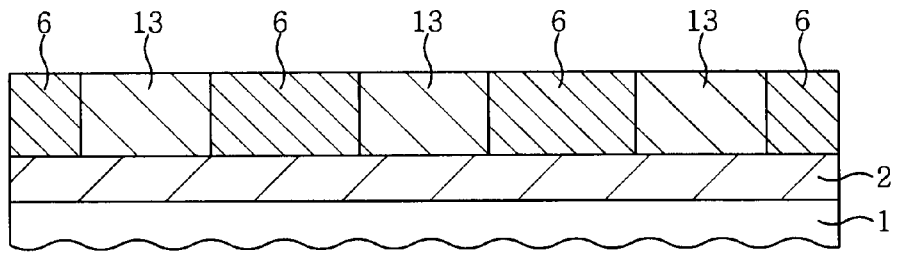
FIGS. 13A to 13D are cross sectional views illustrating the semiconductor device manufacturing method in accordance with the fourth embodiment of the present invention.

Then, as shown in FIG. 13A, the lines 6 are embedded in the grooves and/or holes 15 formed in the sacrificial film 13. The embedding of the lines 6 may be carried out by using a well-known damascene method.

Figure 13B:
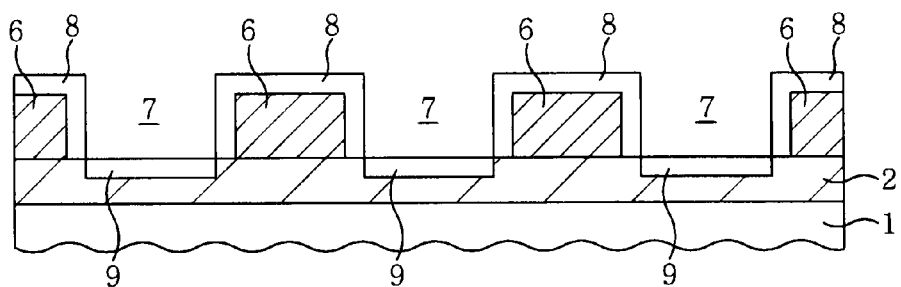

Then, as shown in FIG. 13B, the sacrificial film 13 is removed by using the lines 6 as a mask, so that air gaps 7 are formed between the lines 6. A deteriorated layer, e.g., an oxide layer 8, is formed on the exposed surface of the lines 6. Also, a damage layer 9 is formed on the exposed surface of the interlayer insulating film 2.

Figure 13C:
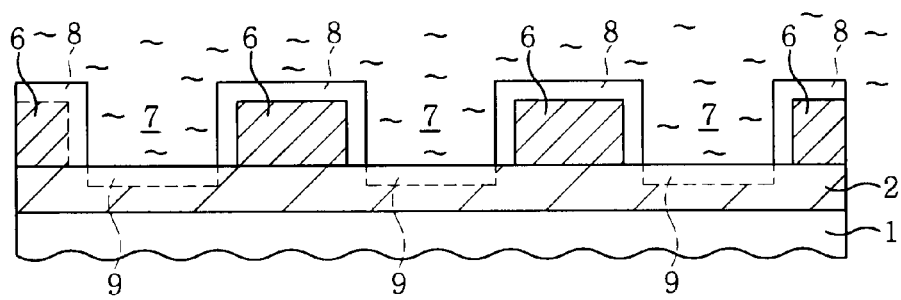

Then, as shown in FIG. 13C, the lines 6 and the interlayer insulating film 2 exposed to the bottom of the air gaps 7 are hydrophobically modified. Consequently, the damage layer 9 formed on the interlayer insulating film 2 is recovered. Further, the deteriorated layer (the oxide layer 8 in this embodiment) formed on the lines 6 is reduced and then removed.

Figure 13D:
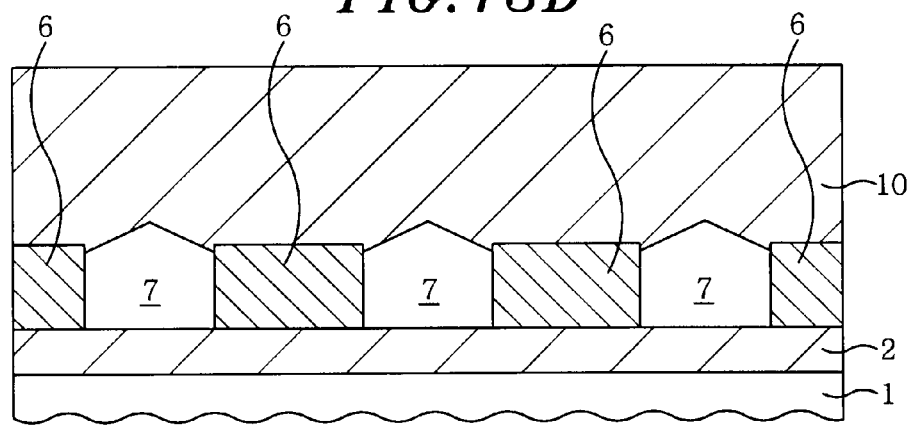

Then, as shown in FIG. 13D, an interlayer insulating film 10 is formed on the lines 6 and the air gaps 7. The interlayer insulating film 10 is formed with poor step coverage such that the air gaps 7 are not filled.

In accordance with the above-described method, the air gaps 7 may be formed by removing the sacrificial film 13, instead of the etch-back of the interlayer insulating film 2.

The manufacturing method of the fourth embodiment has the same advantages as the manufacturing method of the first embodiment.

Fifth Embodiment

In the manufacturing method of the fourth embodiment, the sacrificial film 13 has a single-layer structure. Alternatively, the sacrificial film 13 may have a multi-layer structure. Hereinafter, an example of the sacrificial film 13 having a multi-layer structure will be illustrated as a fifth embodiment.

FIGS. 14A to 14D and FIGS. 15A to 15D are cross sectional views illustrating a semiconductor device manufacturing method in accordance with the fifth embodiment of the present invention.

Figure 14A:
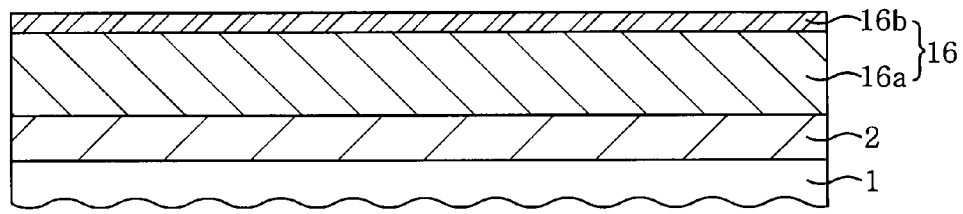
FIGS. 14A to 14D are cross sectional views illustrating a semiconductor device manufacturing method in accordance with a fifth embodiment of the present invention.

First, as shown in FIG. 14A, an interlayer insulating film 2 is formed on a substrate 1. Then, a multi-layer sacrificial film 16 is formed on the interlayer insulating film 2. In this embodiment, the multi-layer sacrificial film 16 is a two-layer film including a removable film 16a and a film 16b through which a fluid permeates (hereinafter, referred to as a "fluid-permeable film"). The removable film 16a is made of a material having higher etching selectivity than the interlayer insulating film 2, the lines 6 formed in the subsequent process and the fluid-permeable film 16b. That is, the material of the removable film 16a is selected such that the removable film 16a is relatively easy to be etched, whereas the interlayer insulating film 2, the lines 6 and the fluid-permeable film 16b are difficult to be etched.

Specifically, when the interlayer insulating film 2 is made of a SiOC-based low-k material and the lines 6 are made of copper (Cu) while tantalium (Ta) is used as barrier metal, the removable film 16a may be made of $SiO_2$.

The fluid-permeable film 16b is formed on the removable film 16a. For example, the fluid-permeable film 16b is a film through which an etching gas or etching solution permeates into the removable film 16a arranged under the fluid-permeable film 16b.

Also, the removable film 16a, which is exposed to an etching gas or etching solution and sublimed or melted, can permeate the fluid-permeable film 16b.

Also, the fluid-permeable film 16b can allow a hydrophobic modification agent to permeate therethrough in hydrophobic modification.

For example, the fluid-permeable film 16b may include a pyrolytic polymer. When the pyrolytic polymer is heated, it becomes porous, allowing permeation of a fluid. For example, the pyrolytic polymer may be polystyrene.

Figure 14B:
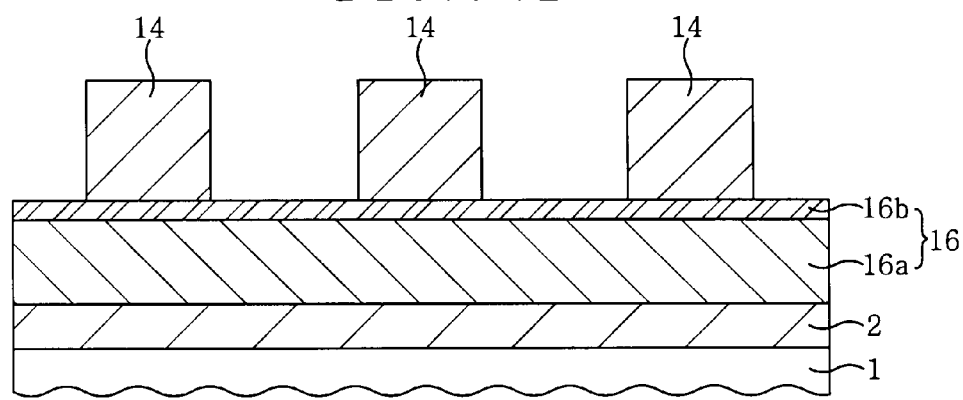

Then, as shown in FIG. 14B, a hard mask pattern 14 is formed on the fluid-permeable film 16b in the same manner as illustrated with reference to FIG. 12B.

Figure 14C:
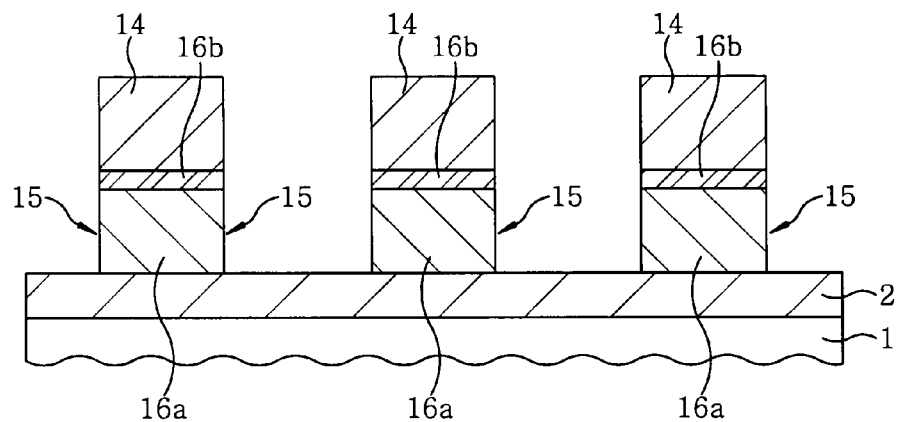

Then, as shown in FIG. 14C, the multi-layer sacrificial film 16 is etched by using the hard mask pattern 14 as a mask, and grooves and/or holes 15 in which lines 6 are to be embedded are formed in the multi-layer sacrificial film 16, in the same manner as illustrated with reference to FIG. 12B.

Figure 14D:
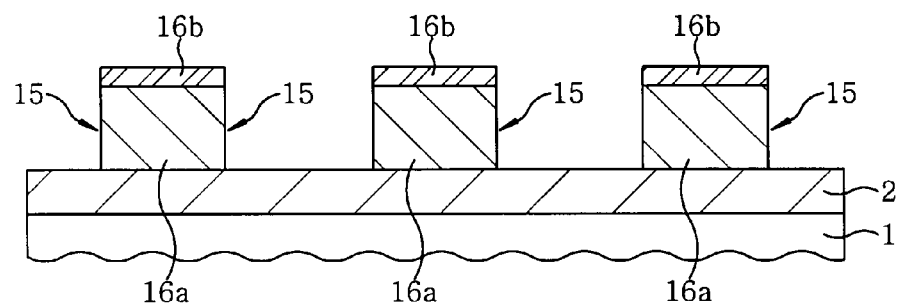

Then, as shown in FIG. 14D, the hard mask pattern 14 is removed.

Figure 15A:
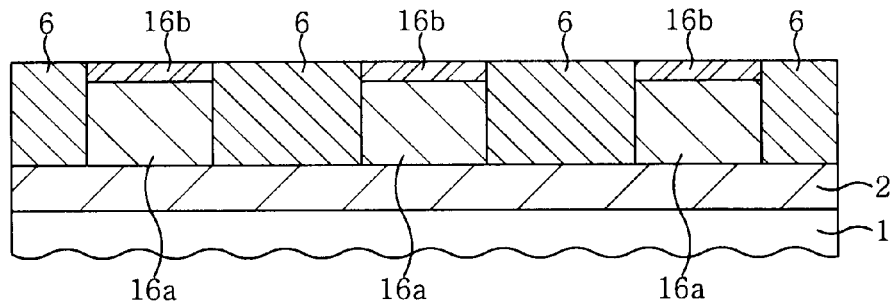
FIGS. 15A to 15D are cross sectional views illustrating the semiconductor device manufacturing method in accordance with the fifth embodiment of the present invention.

Then, as shown in FIG. 15A, lines 6 are embedded into the grooves and/or holes 15, in the same manner as illustrated with reference to FIG. 13A.

Figure 15B:
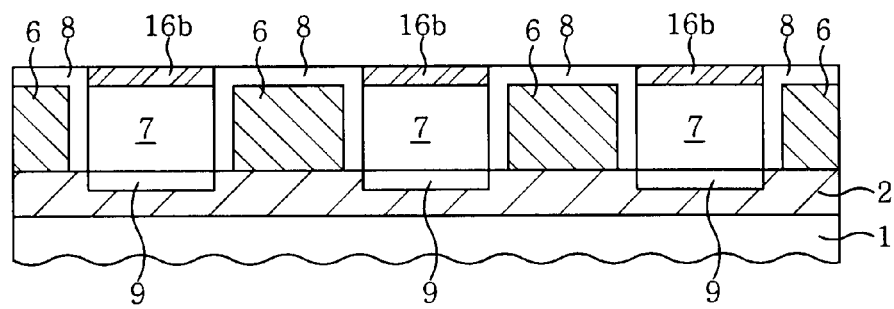

Then, as shown in FIG. 15B, the removable film 16a is removed through the fluid-permeable film 16b by using the lines 6 as a mask, so that air gaps 7 are formed between the lines 6 under the fluid-permeable film 16b.

Figure 15C:
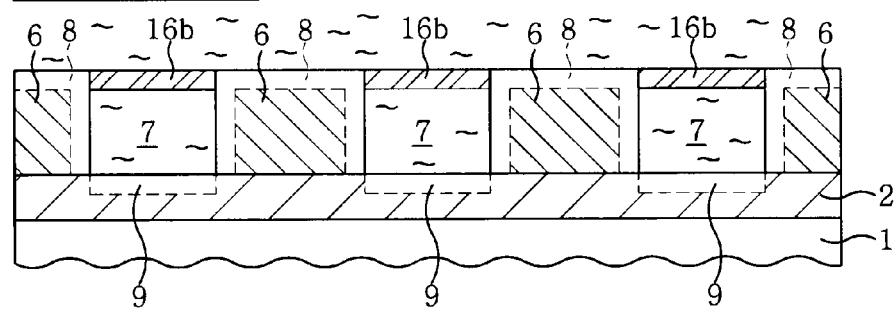

Then, as shown in FIG. 15C, the lines 6 and the interlayer insulating film 2 exposed to the bottom of the air gaps 7 are hydrophobically modified through the fluid-permeable film 16b. Consequently, the damage layer 9 formed on the interlayer insulating film 2 is recovered. Further, the deteriorated layer (the oxide layer 8 in this embodiment) formed on the lines 6 is reduced and then removed.

Figure 15D:
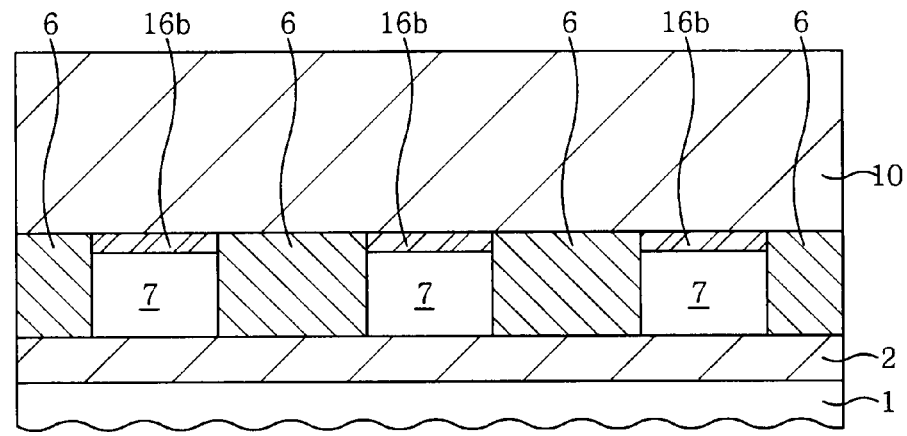

Then, as shown in FIG. 15D, an interlayer insulating film 10 is formed on the lines 6 and the fluid-permeable films 16b. In this embodiment, the fluid-permeable film 16b is present between the lines 6. Accordingly, it is unnecessary to form the interlayer insulating film 10 with poor step coverage which is the above-described film formation condition.

Also in accordance with the above-described method, the air gaps 7 may be formed by removing the removable film 16a, instead of the etch-back of the interlayer insulating film 2.

The manufacturing method of the fifth embodiment has the same advantages as the manufacturing method of the first embodiment.

Sixth Embodiment

Next, a specific embodiment of applying the above-described manufacturing method to a semiconductor device having lines of copper or a copper-containing conductor will be illustrated. Further, although this embodiment employs the method of the third embodiment, it may also employ the methods of the other embodiments.

FIGS. 16A to 16D, FIGS. 17A to 17C, and FIGS. 18A and 18B are cross sectional views illustrating a semiconductor device manufacturing method in accordance with a sixth embodiment of the present invention.

Figure 16A:
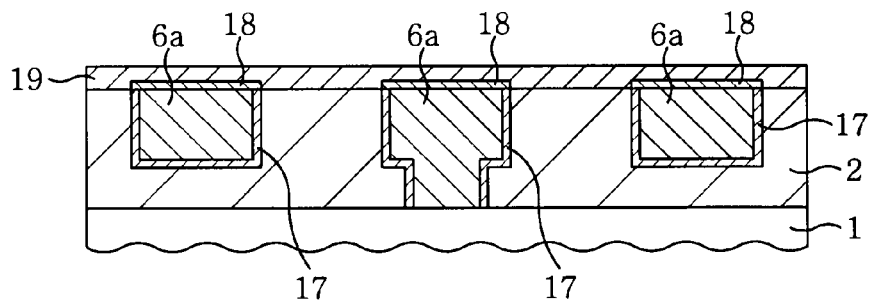
FIGS. 16A to 16D are cross sectional views illustrating a semiconductor device manufacturing method in accordance with a sixth embodiment of the present invention.

First, as shown in FIG. 16A, an interlayer insulating film 2, in which lines of copper or a copper-containing conductor (hereinafter, referred to as "copper lines") 6a are embedded, is formed on a substrate 1. A barrier metal 17 is formed on the side and the bottom of the copper lines 6a to prevent copper from diffusing into the interlayer insulating film 2. Also, a cap metal 18 is formed on the top of the copper lines 6a to prevent diffusion of copper. For example, the barrier metal 17 is tantaluim (Ta), and the cap metal 18 is cobalt-tungsten-phosphorus (CoWP). The interlayer insulating film 2 with the copper lines 6a embedded therein may be formed by using the manufacturing method illustrated with reference to FIGS. 1A to 1F, or another well-known method. Then, a silicon carbide (SiC) film 19 is formed on the interlayer insulating film 2 and the cap metal 18.

Figure 16B:
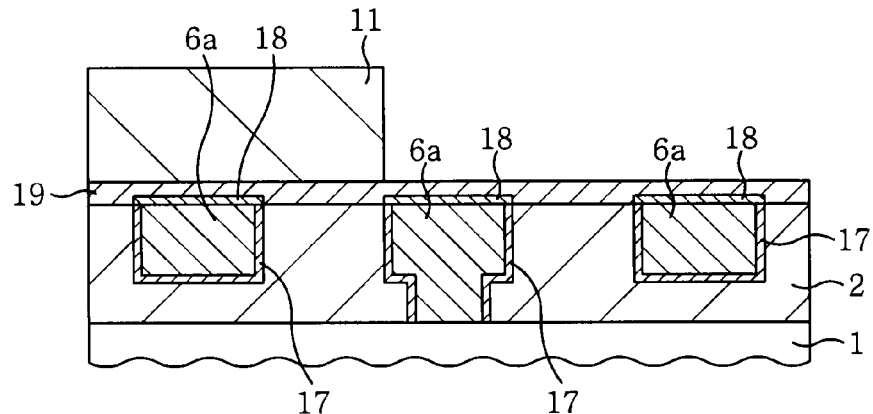

Then, as shown in FIG. 16B, a photoresist pattern 11 serving as a mask to form air gaps is formed on the interlayer insulating film 2, in this embodiment, on the SiC film 19 formed on the interlayer insulating film 2.

Figure 16C:
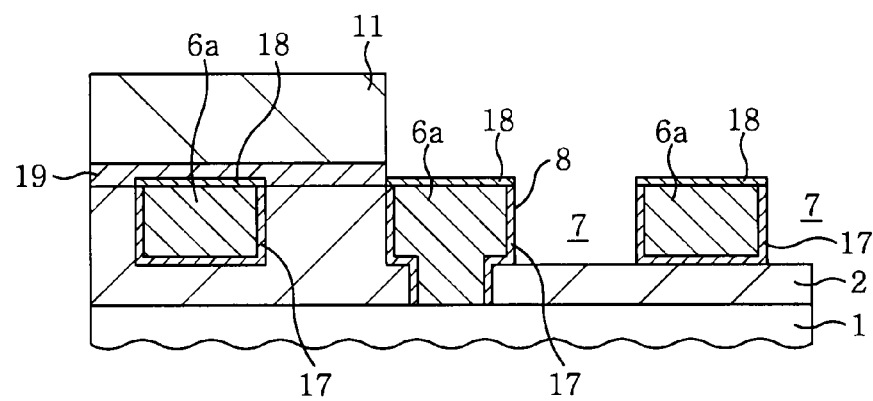

Then, as shown in FIG. 16C, the SiC film 19 and the interlayer insulating film 2 are etched by using the photoresist pattern 11 as a mask, and air gaps 7 are formed in the interlayer insulating film 2.

Figure 16D:
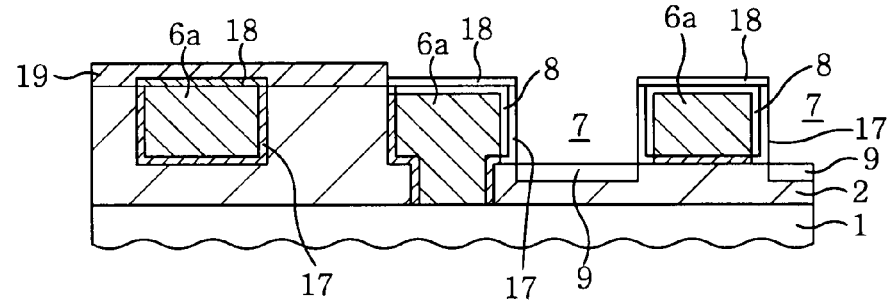

Then, as shown in FIG. 16D, the photoresist pattern 11 is removed by ashing. A damage layer 9 is formed on the exposed surface of the interlayer insulating film 2 by the etching shown in FIG. 16C, and the ashing of the photoresist pattern 11. Also, a deteriorated layer, e.g., an oxide layer 8 is formed on the copper lines 6a, the barrier metal 17 and the cap metal 18 due to the etching shown in FIG. 16C, and the ashing of the photoresist pattern 11.

Figure 17A:
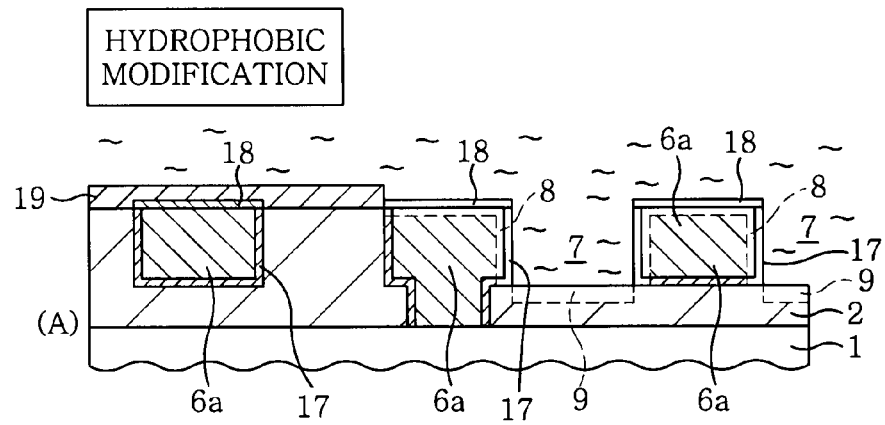
FIGS. 17A to 17C are cross sectional views illustrating the semiconductor device manufacturing method in accordance with the sixth embodiment of the present invention.

Then, as shown in FIG. 17A, the interlayer insulating film 2 with the air gaps 7 and the copper lines 6a are hydrophobically modified. Consequently, the damage layer 9 formed on the interlayer insulating film 2 is recovered. Further, the deteriorated layer (the oxide layer 8 in this embodiment) formed on the copper lines 6a, the barrier metal 17 and the cap metal 18 is reduced and removed.

Figure 17B:
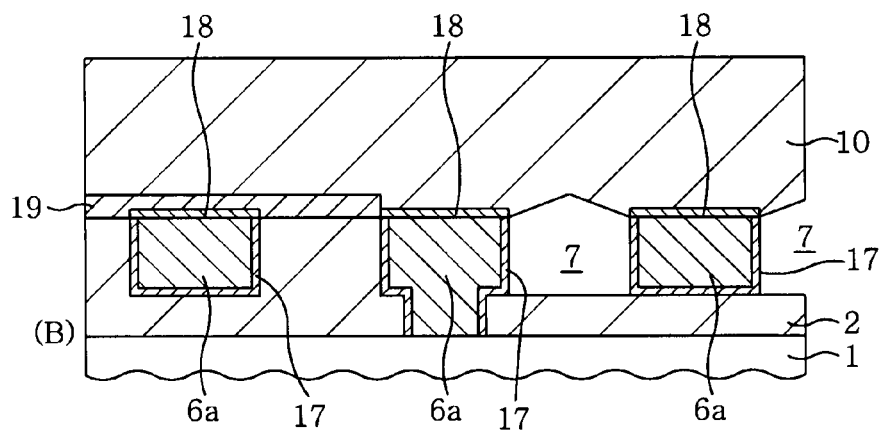

Then, as shown in FIG. 17B, an interlayer insulating film 10 is formed on the copper lines 6a and the air gaps 7. The interlayer insulating film 10 is formed with poor step coverage such that the air gaps 7 are not filled.

Figure 17C:
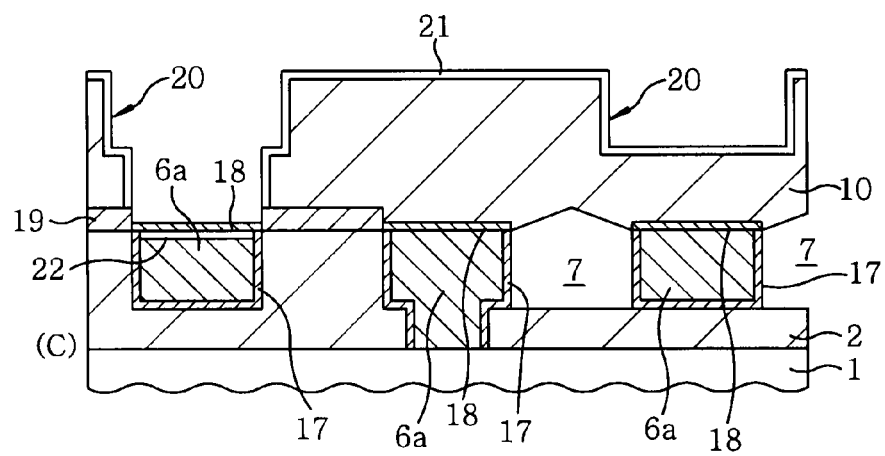

Then, as shown in FIG. 17C, grooves and/or holes 20 in which upper lines are to be embedded are formed in the interlayer insulating film 10. The formation of the grooves and/or holes 20 may be carried out by using the manufacturing method illustrated with reference to FIGS. 1B and 1C. A damage layer 21 is formed on the exposed surface of the interlayer insulating film 10 by etching of the interlayer insulating film 10 and ashing of a photoresist pattern (not shown) used to form the grooves and/or holes 20.

Also, a deteriorated layer, e.g., an oxide layer 22, is formed on the copper lines 6a (the cap metal 18 and the copper lines 6a in this embodiment) exposed to the bottom of the grooves and/or holes 20 due to the etching and ashing.

Figure 18A:
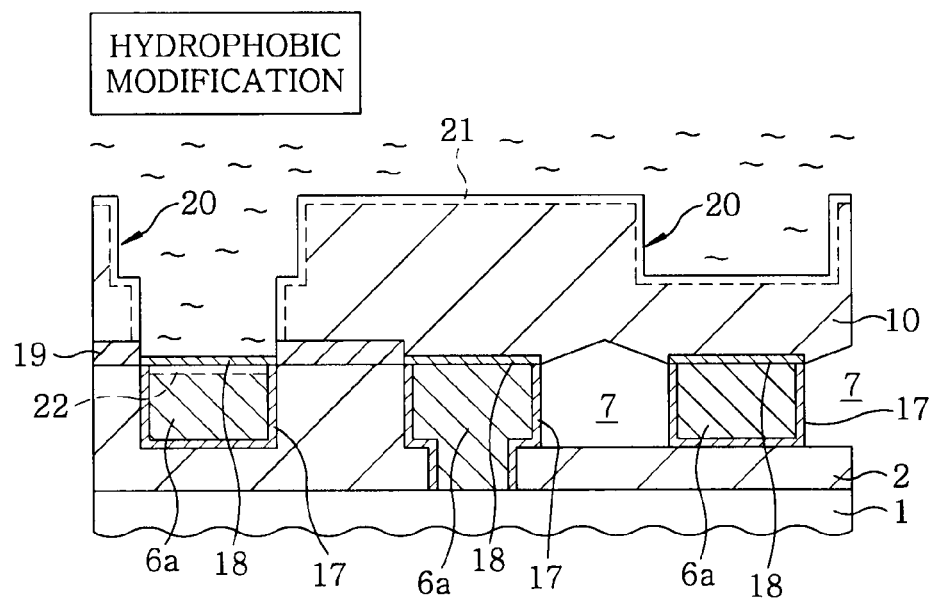
FIGS. 18A and 18B are cross sectional views illustrating the semiconductor device manufacturing method in accordance with the sixth embodiment of the present invention.

Then, as shown in FIG. 18A, the interlayer insulating film 10 with the grooves and/or holes 20 is hydrophobically modified. Consequently, the damage layer 21 foremd on the interlayer insulating film 10 is recovered. Also, the oxide layer 22 formed on the copper lines 6a or the cap metal 18 is reduced and removed.

Figure 18B:
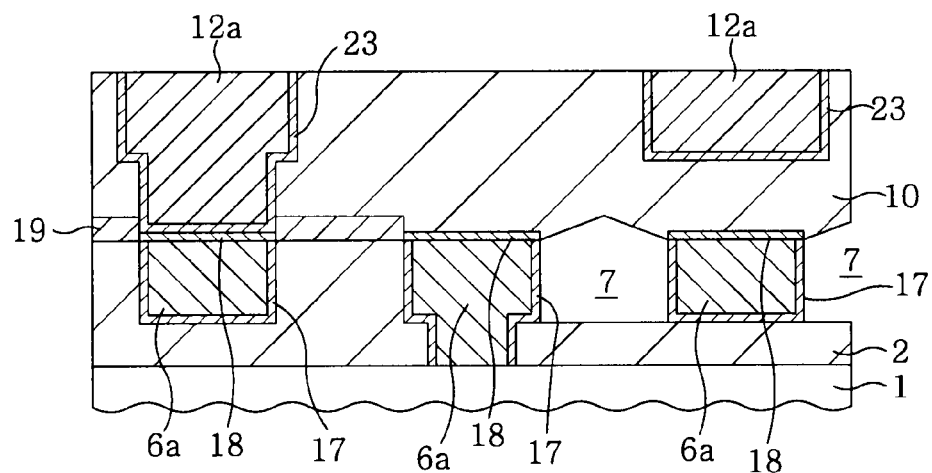

Then, as shown in FIG. 18B, a barrier metal 23 is formed on the interlayer insulating film 10, copper or a copper-containing conductor is formed on the barrier metal 23. Then, the copper or the copper-containing conductor is polished by, e.g., mechanical chemical polishing. That is, the copper or the copper-containing conductor is embedded into the grooves and/or holes 20. As a result, upper copper lines 12a are formed.

As described above, the manufacturing method in accordance with the embodiments of the present invention may be also applied to the manufacture of a semiconductor device having lines made of copper or a copper-containing conductor.

The manufacturing method of the sixth embodiment has the same advantages as the manufacturing method of the first embodiment.

Seventh Embodiment

Next, an example of a semiconductor device manufacturing system for performing the manufacturing methods in accordance with the embodiments of the present invention will be described.

Figure 19:
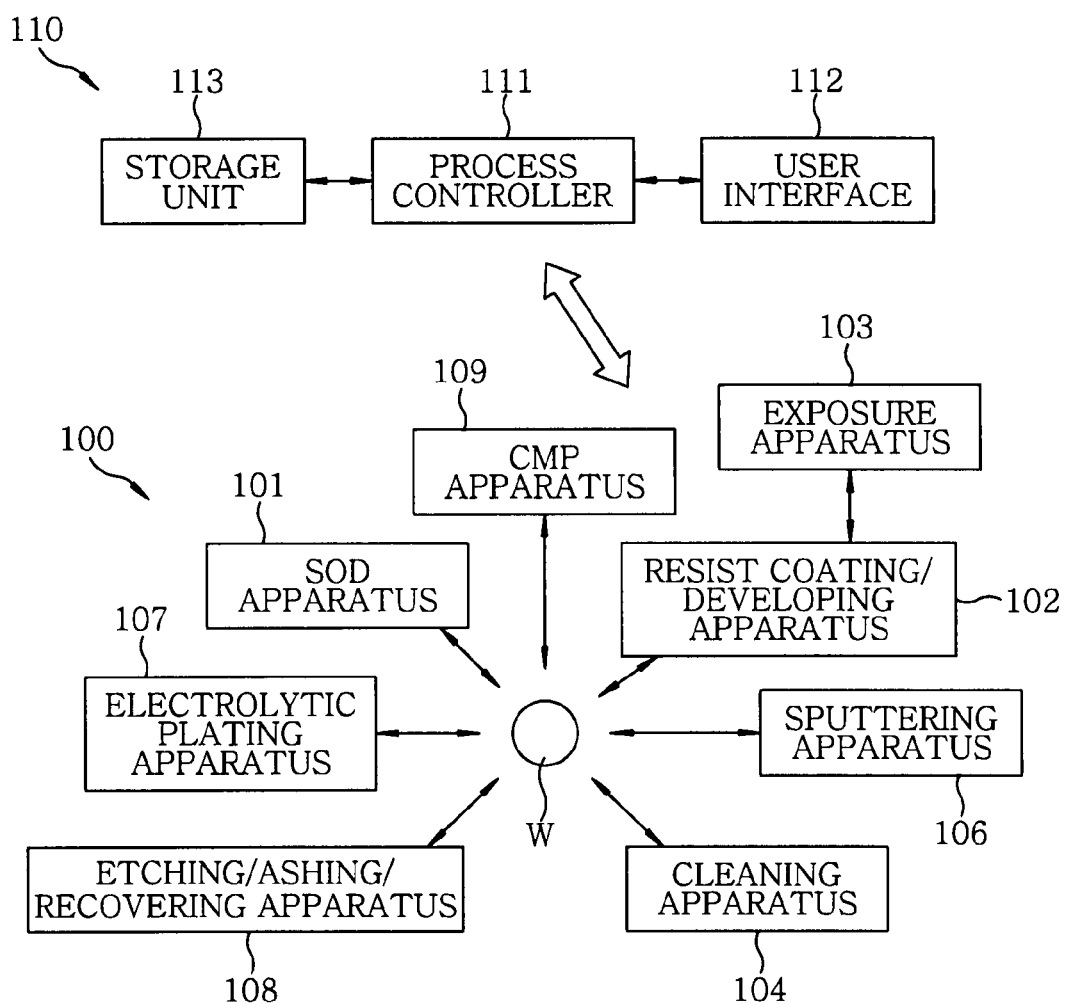
FIG. 19 is an explanatory diagram showing a schematic configuration of a semiconductor device manufacturing system used in the the manufacturing methods in accordance with the embodiments of the present invention.

FIG. 19 is an explanatory diagram showing a schematic configuration of a semiconductor device manufacturing system used in the manufacturing methods in accordance with the embodiments of the present invention.

As shown in FIG. 19, the semiconductor device manufacturing system comprises a processing part 100 including a spin on dielectric (SOD) apparatus 101, a resist coating/developing apparatus 102, an exposure apparatus 103, a sputtering apparatus 106, an electrolytic plating apparatus 107, a CMP apparatus 109 serving as a polishing apparatus, an etching/ashing/recovering apparatus 108 for performing dry etching, dry ashing and recovering processes and a cleaning apparatus 104, and a main controlling part 110.

Each apparatus of the processing part 100 is connected to and controlled by a process controller 111 having a CPU. The process controller 111 is connected to a user interface 112, including a keyboard for inputting commands or a display for displaying an operation status of each apparatus of the processing part 100, so as to allow a process manager to manage each apparatus of the processing part 100. Further, the process controller 111 is also connected to a storage unit 113 which stores recipes including control programs for implementing various processes of the processing part 100 under control of the process controller 111, process condition data and the like.

If necessary, as a certain recipe is retrieved from the storage unit 113 in accordance with an instruction inputted through the user interface 112 and executed in the process controller 111, a desired process is performed in the processing part 100 under control of the process controller 111. Further, the recipes can be stored in and retrieved from a computer-readable storage medium such as a CD-ROM, a hard disk, a flexible disk and a non-volatile memory, or retrieved through an on-line connected via, e.g., a dedicated line to the apparatuses of the processing part 100 or an external apparatus available all the time. The recipes include programs for performing the methods of the aforementioned embodiments in the processing part 100.

Further, the main controlling part 110 may perform all control operations. Alternatively, the main controlling part 110 may perform only the overall control, and controllers may be provided in the respective apparatuses or several groups of the apparatuses to perfom contol operations separately.

The cleaning apparatus 104 includes a cleaning unit, a heater and a transfer unit to perform a cleaning process on a semiconductor substrate (wafer) W.

As illusrated below, the etching/ashing/recovering apparatus 108 performs a dry etching process to form the grooves or holes 4 or 20 with a predetermined pattern on the interlayer insulating film (low-k film), a dry ashing process to remove the photoresist pattern 3 or 11 and a recovering process to recover damage of the interlayer insulating film 2 or 10. These processes are continuously carried out by dry processing under vacuum.

Figure 20:
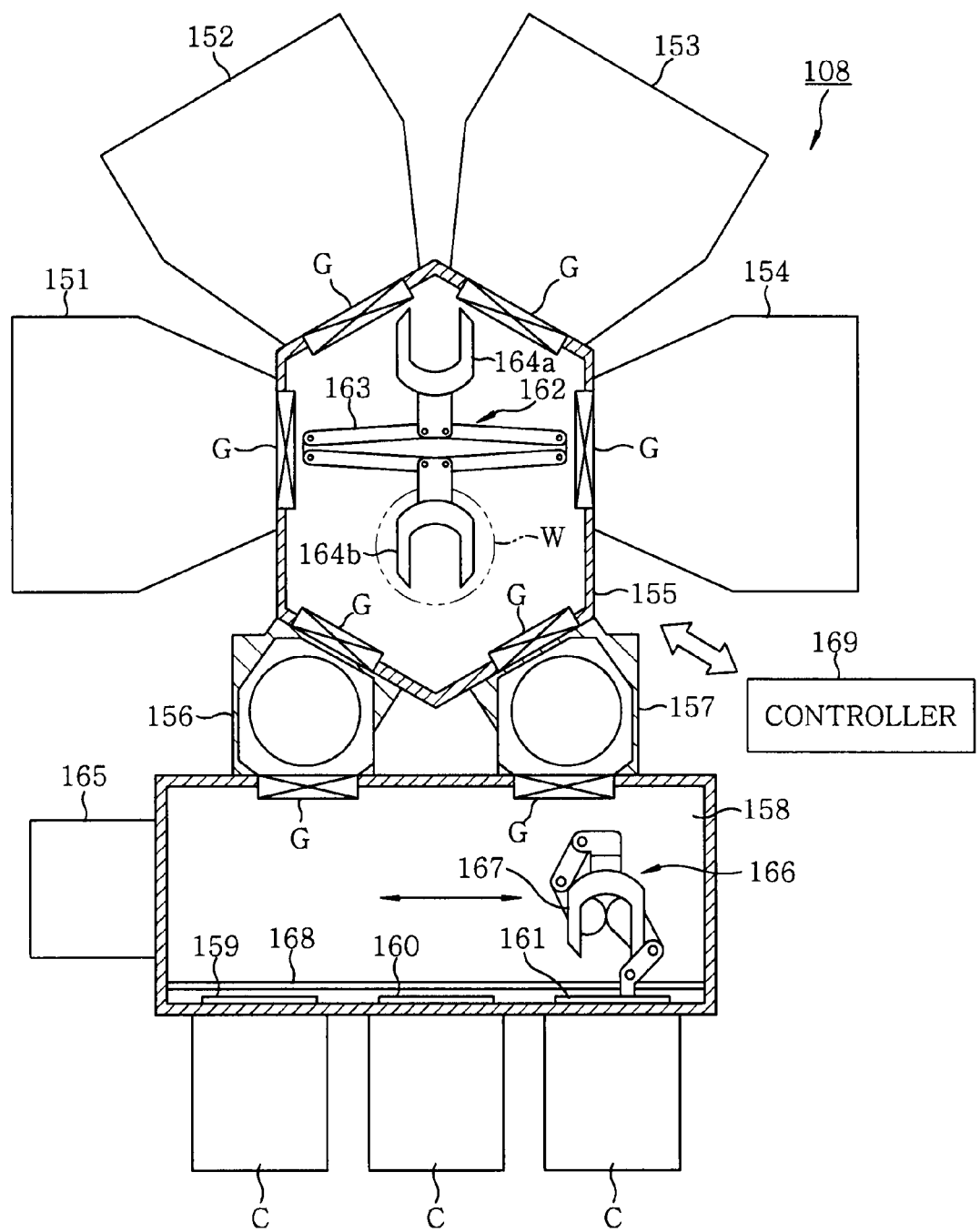
FIG. 20 is a plan view illustrating a schemactic configuration of an etching/ashing/recovering apparatus of the semiconductor device manufacturing system shown in FIG. 19.

FIG. 20 is a plan view illustrating a schemactic configuration of an etching/ashing/recovering apparatus of the semiconductor device manufacturing system shown in FIG. 19.

As shown in FIG. 20, the etching/ashing/recovering apparatus 108 includes etching units 151 and 152 for performing dry etching (plasma etching), an ashing unit 153 for performing dry ashing (plasma ashing), and a silyation processing unit 154 for performing a recovering process (hydrophobic modification). These units 151 to 154 are respectively disposed corresponding to four sides of a hexagonal wafer transfer chamber 155. The other two sides of the wafer transfer chamber 155 are respectively connected to load-lock chambers 156 and 157. A wafer loading/unloading chamber 158 is connected to the load-lock chambers 156 and 157 on their sides opposite to the wafer transfer chamber 155. The wafer loading/unloading chamber 158 has three ports 159, 160, and 161 on its side opposite to the load-lock chambers 156 and 157, wherein three carriers C capable of containing wafers W are mounted on the three ports, respectively.

The etching units 151 and 152, the ashing unit 153, the silylation processing unit 154, and the load-lock chambers 156 and 157 are connected to the sides of the wafer transfer chamber 155 respectively through gate valves G, as shown in FIG. 20. Each of the units 151 to 154 and the chambers 156 and 157 communicates with the wafer transfer chamber 155 by opening the corresponding gate valve G, and is blocked from the wafer transfer chamber 155 by closing the corresponding gate valve G. Gate valves G are also disposed between the load-lock chambers 156 and 157 and the wafer loading/unloading chamber 158. Each of the load-lock chambers 156 and 157 communicates with the wafer loading/unloading chamber 158 by opening the corresponding gate valve G, and is blocked from the wafer loading/unloading chamber 158 by closing the corresponding gate valve G.

The wafer transfer chamber 155 is provided with a wafer transfer unit 162 disposed therein, for transferring wafers W to and from the etching units 151 and 152, the ashing unit 153, the silylation processing unit 154, and the load-lock chambers 156 and 157. The wafer transfer unit 162 is disposed substantially at the center of the wafer transfer chamber 155. The wafer transfer unit 162 includes two rotating and extending/retracting portions 163 which are rotatable, extensible and contractible. Two blades 164a and 164b, each blade for supporting a wafer W, are respectively connected to the leading ends of the rotating and extending/retracting portions 163. The two blades 164a and 164b are connected to the rotating and extending/retracting portions 163 to be arranged in opposite directions. Further, the inside of the wafer transfer chamber 155 is maintained at a predetermined vacuum level.

A HEPA filter (not shown) is provided on the ceiling of the wafer loading/unloading chamber 158. Clean air passing through the HEPA filter is supplied in a downflow fashion into the wafer loading/unloading chamber 158. The loading/unloading of the wafer W is carried out under an atmospheric pressure of clean air. Shutter (not shown) are respectively provided at the three ports 159, 160 and 161 of the wafer loading/unloading chamber 158 for attachment of carriers C. The carrier C containing wafers W or empty carrier C is mounted directly on each of the three ports 159, 160 and 161. When the carrier C is mounted, the shutter is closed such that the carrier C communicates with the wafer loading/unloading chamber 158 while preventing inflow of outside air. Further, an alignment chamber 165 for performing alignment of a wafer W is disposed on one side of the wafer loading/unloading chamber 158.

The wafer loading/unloading chamber 158 is provided with a wafer transfer unit 166 disposed therein, for transferring wafers W to and from the carriers C and load-lock chambers 156 and 157. The wafer transfer unit 166 has a multi-joint arm structure and can move on a rail 168 in a direction in which the carriers C are arranged, to transfer a wafer W placed on a hand 167 at its leading end. The overall control, e.g., the operation of the wafer transfer units 162 and 166, is carried out by a controller 169.

Next, the respective units will be described in detail.

First, explanation of the ashing unit 153 will be given below. The etching units 151 and 152 have the same structure as the ashing unit except using different gases. Thus, explanation of the etching units will be omitted.

Figure 21:
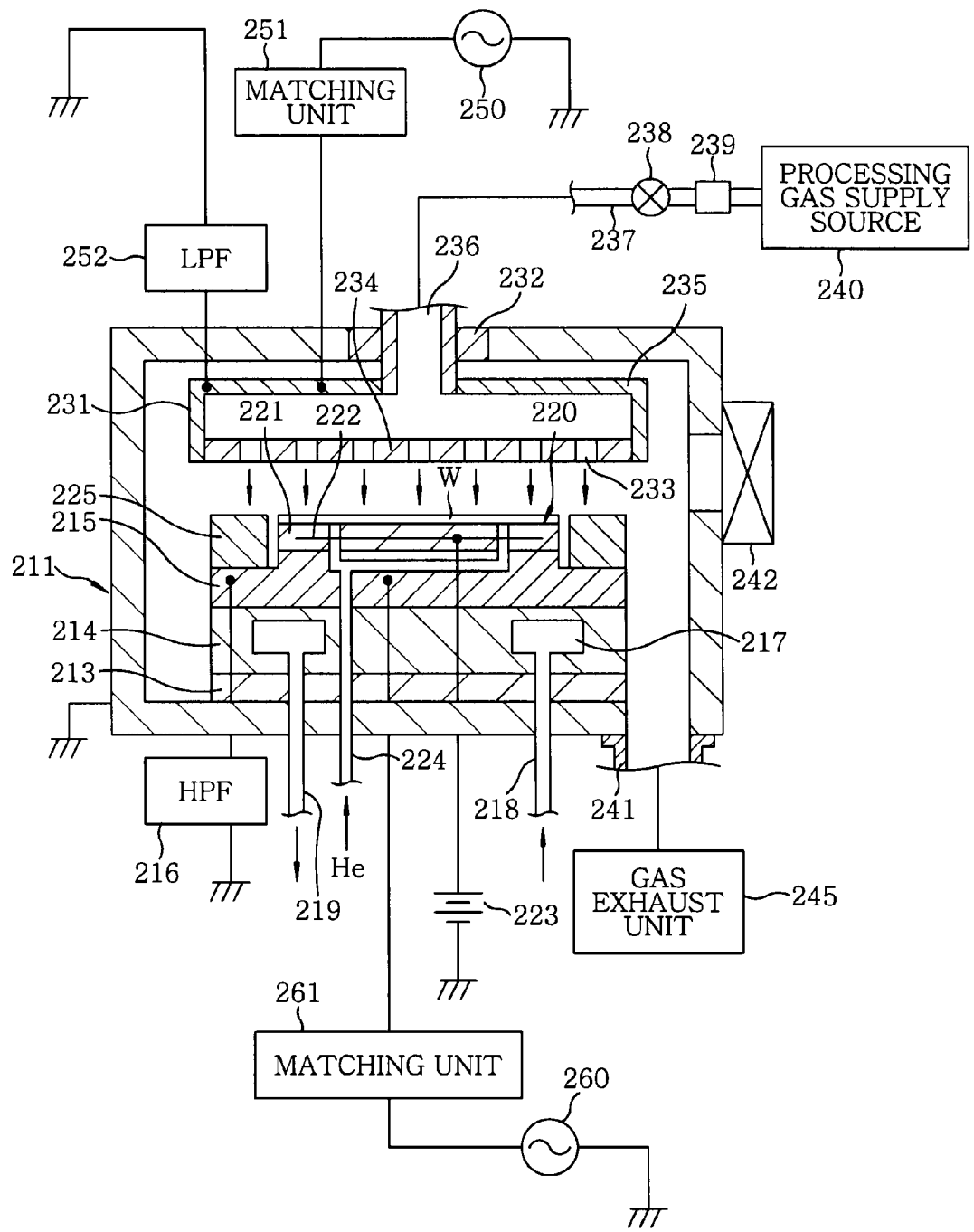
FIG. 21 is a cross sectional view schematically showing the ashing unit of the etching/ashing/recovering apparatus.

FIG. 21 is a cross sectional view schematically showing the ashing unit of the etching/ashing/recovering apparatus.

As shown in FIG. 21, the ashing unit 153 for performing plasma ashing includes a processing chamber 211 having a substantially cylindrical shape. A susceptor support 214 is disposed at the bottom of the processing chamber 211 through an insulating plate 213, and a susceptor 215 is arranged on the susceptor support 214. The susceptor 215 also serves as a lower electrode, and a wafer W is mounted on the top of the susceptor 215 through an electrostatic chuck 220. A reference numeral 216 indicates a high pass filter (HPF).

The susceptor support 214 includes a temperature control medium path 217, in which a temperature control medium circulates, to adjust the temperature of the susceptor 215 to a desired value. The temperature control medium path 217 is connected to an inlet pipe 218 and an outlet pipe 219.

The electrostatic chuck 220 has a structure in which an electrode 222 is interposed between insulating members 221. A DC voltage is applied to the electrode 222 from a DC power supply 223 such that the wafer W is electrostatically adsorbed on the electrostatic chuck 220. A heat transfer gas, e.g., He gas, is supplied through a gas channel 224 to the backside of the wafer W, and the temperature of the wafer W is adjusted to a desired level through the heat transfer gas. An annular focus ring 225 is disposed on an upper peripheral portion of the susceptor 215 to surround the wafer W mounted on the electrostatic chuck 220.

An upper electrode 231 is provided above the susceptor 215 such that it faces the susceptor 215. The upper electrode 231 is supported at an upper side of the processing chamber 211 via an insulating material 232. The upper electrode 231 includes an electrode plate 234 including a plurality of discharge openings 233 and an electrode supporter 235 for supporting the electrode plate 234. The upper electrode 231 has a shower head shape.

A gas inlet port 236 is provided at the center of the electrode supporter 235 and is connected to a gas supply pipe 237. The gas supply pipe 237 is connected to a process gas supply source 240 for supplying an ashing gas through a valve 238 and a mass flow controller 239. An ashing gas, e.g., $O_2$, $NH_3$, or $CO_2$ gas, is supplied from the process gas supply source 240 to the processing chamber 211.

The bottom of the processing chamber 211 is connected to a gas exhaust pipe 241 which is connected to a gas exhaust unit 245. The gas exhaust unit 245 includes a vacuum pump such as a turbo molecular pump such that an inner pressure of the processing chamber 211 can be reduced to a predetermined level. A gate valve 242 is provided at a sidewall of the processing chamber 211.

An upper electrode 231 is connected to a first high frequency power supply 250 for supplying high frequency power for generation of plasma via a first matching unit 251. Further, the upper electrode 231 is connected to a low pass filter (LPF) 252. The susceptor 215 serving as a lower electrode is connected to a second high frequency power supply 260 for attracting ions in the plasma to perform ashing via a second matching unit 261.

In the ashing unit 153, a specific ashing gas is introduced from the processing gas supply source 240 into the processing chamber 211. Then, the ashing gas is converted into plasma by the high frequency power supplied from the first high frequency power supply 250. The plasma allows, e.g., a resist film formed on the wafer W to be carbonized and removed.

Next, the silylation processing unit 154 will be described in detail. The silylation processing unit 154 performs hydrophobic modification described in the methods of the aforementioned embodiments.

Figure 22:
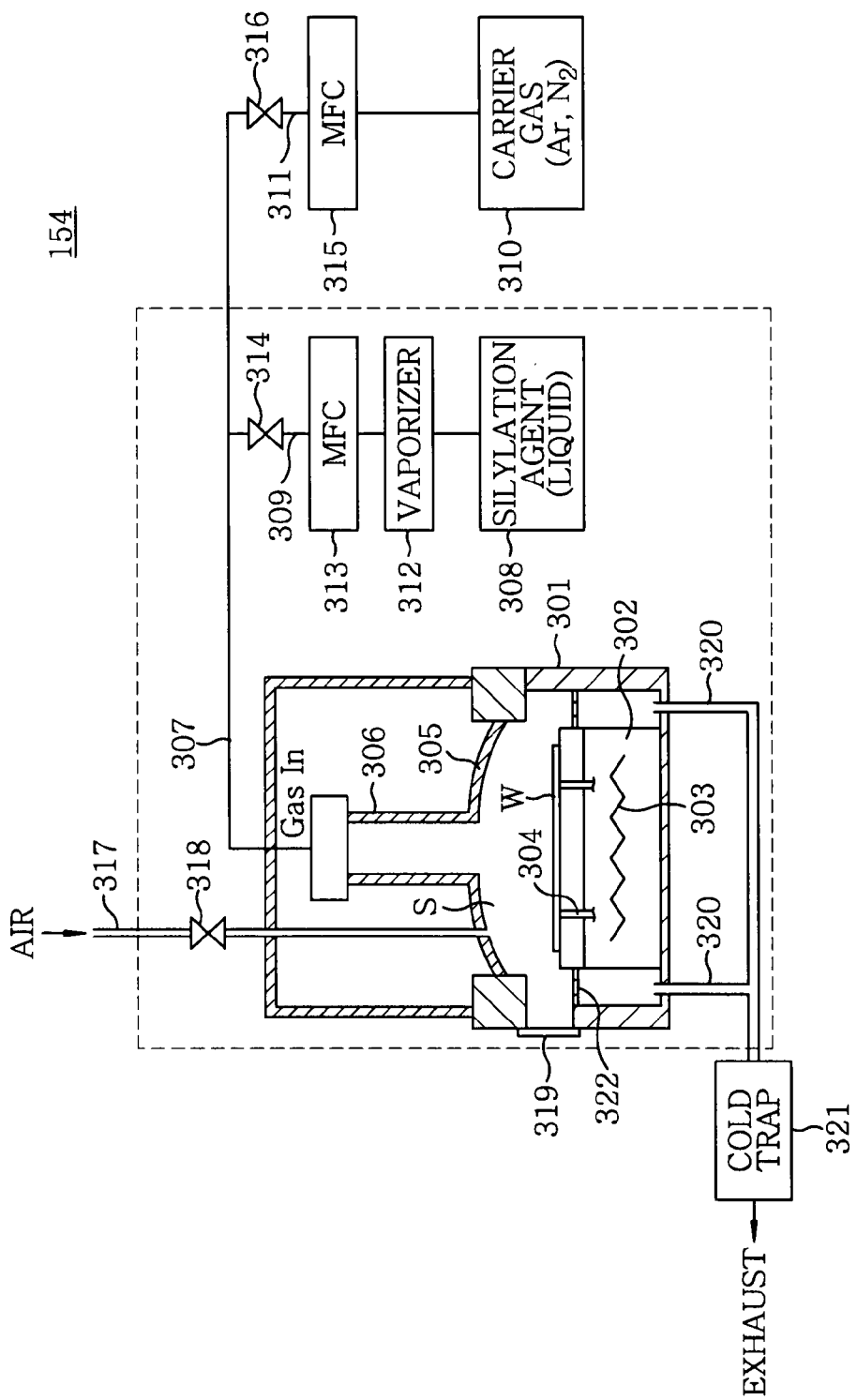
FIG. 22 is a cross sectional view schematically showing the silylation processing unit of the etching/ashing/recovering apparatus.

FIG. 22 is a cross sectional view schematically showing the silylation processing unit of the etching/ashing/recovering apparatus.

As shown in FIG. 22, the silylation processing unit 154 includes a chamber 301 accommodating a wafer wafer W, and a wafer mounting table 302 is disposed at a lower portion of the chamber 301. A heater 303 is embedded in the wafer mounting table 302 to heat the wafer W mounted on the wafer mounting table 302 to a desired temperature. The wafer mounting table 302 is provided with wafer lifting pins 304 which can be protruded from or retracted into the wafer mounting table 302. The wafer lifting pins 304 can place the wafer W at a predetermined position above and separated from the wafer mounting table 302, when the wafer W is transferred to and from the wafer mounting table 302.

The chamber 301 is provided with an inner vessel 305 which defines a narrow processing space S containing the wafer W. A silylation agent (hydrophobic modification gas) is supplied into the processing space S. The inner vessel 305 has a gas inlet path 306 formed at its center and extending in a vertical direction.

An upper portion of the gas inlet path 306 is connected to a gas supply line 307. The gas supply line 307 is connected to a line 309 extending from a silylation agent supply source 308 for supplying a silylation agent such as N-trimethylsilyldimethylamine (TMSDMA) and a line 311 extending from a carrier gas supply source 310 for supplying a carrier gas such as Ar or $N_2$ gas. The line 309 is provided with a vaporizer 312 for vaporizing the silylation agent, a mass flow controller 313 and a valve 314 arranged in this order from the silylation agent supply source 308. The line 311 is provided with a mass flow controller 315 and a valve 316 arranged in this order from the carrier gas supply source 310. The silylation agent vaporized by the vaporizer 312 is carried by the carrier gas and is supplied through the gas supply line 307 and the gas inlet path 306 into the processing space S defined by the inner vessel 305. When the process is performed, the wafer W is heated by the heater 303 to a predetermined temperature. In this case, the wafer temperature can be controlled, e.g., in a range from a room temperature to 300° C.

An air inlet line 317 is installed to extend from the atmosphere outside the chamber 301 to the inner vessel 305 inside the chamber 301. The air inlet line 317 is provided with a valve 318. As the valve 318 is opened, air is introduced into the processing space S defined by the inner vessel 305 inside the chamber 301. Accordingly, a predetermined amount of moisture is supplied into the wafer W.

A gate valve 319 is provided at a sidewall of the chamber 301. While the gate valve 319 is opened, the wafer W is loaded into or unloaded from the chamber 301. Gas exhaust lines 320 are provided at a bottom peripheral portion of the chamber 301. Thus, the inside of the chamber 301 can be exhausted to a predetermined pressure, e.g., to 10 Torr (1333 Pa) or less by a vacuum pump (not shown) through the gas exhaust lines 320. A cold trap 321 is disposed on the gas exhaust lines 320. A baffle plate 322 is disposed between an upper portion of the wafer mounting table 302 and the chamber wall.

Further, the etching/ashing/recovering apparatus 108 continuously performs etching, ashing and recovering processes under a vacuum atmosphere. Accordingly, moisture is hardly present in the space containing the wafer W. Consequently, in the silylation processing unit 154, a silylation reaction is difficult to occur, and it may be difficult to obtain a sufficient recovering effect.

In order to solve this problem, the controller 169 may control the silylation processing unit 154 as follows. That is, introduction of air is carried out by opening the valve 318 of the air inlet line 317 prior to introduction of a silylation agent such that moisture is adsorbed on the wafer W. Then, the heater 303 heats the wafer W mounted on the wafer mounting table 302 to adjust the moisture and introduction of the silylation agent is carried out. In this case, the heating temperature ranges preferably from 50 to 200° C. Further, in order to accelerate the silylation, the wafer W may be heated after the introduction of the silylation agent.

Further, the ashing unit 153 shown in FIG. 21 may perform all or two of etching, ashing and recovering processes. That is, when the processing gas supply source 240 can supply etching and ashing gases, etching is performed with the etching gas and, then, ashing is performed with the ashing gas. Also, when the processing gas supply source 240 can supply an etching gas, an ashing gas and a silylation agent, etching is primarily performed with the etching gas, ashing is secondarily performed with the ashing gas, and silylation is thirdly performed with the silylation agent. In this case, the ashing unit 153 needs to be provided with a device for supplying moisture to the wafer W to perform the silylation process.

Further, in the etching/ashing/recovering apparatus 108, air is introduced into the silylation processing unit 154 prior to the silylation. Alternatively, air may be introduced into other units, e.g., the wafer transfer chamber 155, to supply moisture to the wafer W. Also, other substances, e.g., purified water vapor, rather than air, may be supplied as a moisture source.

The method in accordance with the embodiments of the present invention may be carried out by using the semiconductor device manufacturing system.

While the invention has been shown and described with respect to the embodiments, it will be understood by those skilled in the art that various changes and modification may be made without departing from the scope of the invention as defined in the following claims.

For example, the silylation has been described as an example of hydrophobic modification, but the hydrophobic modification may be carried out by using other gases.

Further, preferably, the interlayer insulating film is a low-k film. The low-k film may be a porous methyl-hydrogen-silsesquioxane (MSQ) film formed by an SOD apparatus, or an SiOC-based film serving as an inorganic insulating film formed by CVD. The low-k film is not limited thereto.

What is claimed is:

1. A semiconductor device manufacturing method comprising:
    forming a film layer including a first interlayer insulating film on a semiconductor substrate;
    forming grooves and/or holes in the film layer by etching the film layer, wherein a first damage layer is formed on the film layer exposed by etching the film layer;
    hydrophobically modifying the first damage layer, thereby recovering the first damage layer;
    embedding lines in the grooves and/or holes where the first damage layer is recovered;
    forming air gaps between the lines by etching the film layer using the lines as a mask, wherein a second damage layer is formed on surfaces of the film layer and the lines exposed by forming the air gaps;
    hydrophobically modifying the second damage layer, thereby recovering the second damage layer; and then
    forming a second interlayer insulating film on the lines without filling the air gaps therebetween.

2. The method of claim 1, wherein the air gaps are formed such that the film layer remains on sidewalls of a part of the lines or all the lines after forming the air gaps.

3. The method of claim 2, wherein the lines, on the sidewalls of which the film layer remains, come in contact with upper lines.

4. The method of claim 2, wherein the film layer further includes a sacrificial film.

5. The method of claim 4, wherein the sacrificial film is a multi-layer film including a removable film and a fluid-permeable film, and
    wherein said forming the air gaps includes removing the removable film through the fluid-permeable film.

6. The method of claim 4, wherein the sacrificial film is a multi-layer film including a removable film and a fluid-permeable film,
    wherein said forming the air gaps includes removing the removable film through the fluid-permeable film, and
    wherein said hydrophobically modifying the second damage layer is carried out after said removing the removable film.

7. The method of any one of claims 1, 2-4, 5 and 6, wherein the first and second interlayer insulating film is a low-k film.

8. The method of any one of claims 1, 2-4, 5 and 6, wherein the hydrophobically modifying the first and the second damage layer is carried out by substituting methyl groups as end groups.

9. The method of any one of claims 1, 2-4, 5 and 6 wherein the hydrophobically modifying the first and the second damage layer is carried out under an atmosphere containing a compound selected from the group consisting of trimethylsilyl dimethylamine (TMSDMA), 1,1,3,3-tetramethyldisilazane (TMDS), hexamethyldisilazane (HMDS), dimethylsilyldimethylamine (DMSDMA), trimethylmethylaminosilane (TMMAS), trimethyl(isocyanato)silane (TMICS), trimethylsilylacetylene (TMSA), trimethylsilycyanide (TMSC), 1-trimethylsilylpyrole (TMSPyrole), N, O-bis(trimethylsilyl)trifluoroacetamide (BSTFA), and bis(dimethylamino)dimethylsilane (BDMADMS).

10. A storage medium storing a program which runs on a computer and, when executed, controls a semiconductor device manufacturing system to perform the method described in claim 1.

11. The method any one of claims 1, 2-4, 5 and 6, wherein the second interlayer insulating film is formed with poor step coverage.